(12) United States Patent
Tachibana

(10) Patent No.: US 10,810,130 B2
(45) Date of Patent: Oct. 20, 2020

(54) CACHE MEMORY DEVICE WITH ACCESS CONTROLLER THAT ACCESSES ONE OF DATA MEMORY AND MAIN MEMORY BASED ON RETAINED CACHE HIT DETERMINATION RESULT IN RESPONSE TO NEXT ACCESS

(71) Applicant: RENESAS ELECTRONICS CORPORATION, Tokyo (JP)

(72) Inventor: Tatsuhiro Tachibana, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 15/815,361

(22) Filed: Nov. 16, 2017

(65) Prior Publication Data
US 2018/0181493 A1    Jun. 28, 2018

(30) Foreign Application Priority Data
Dec. 22, 2016  (JP) .................................. 2016-249062

(51) Int. Cl.
*G06F 12/0895*    (2016.01)
*G06F 12/0846*    (2016.01)
(Continued)

(52) U.S. Cl.
CPC ...... *G06F 12/0895* (2013.01); *G06F 12/0846* (2013.01); *G06F 12/0862* (2013.01); *G06F 2212/1021* (2013.01); *G06F 2212/6024* (2013.01); *G06F 2212/6026* (2013.01); *G11C 7/065* (2013.01); *G11C 11/4091* (2013.01); *G11C 11/4093* (2013.01)

(58) Field of Classification Search
CPC ..... G06F 12/0895; G06F 9/38; G06F 12/0846
See application file for complete search history.

(56) References Cited

U.S. PATENT DOCUMENTS 5,133,060 A * 7/1992 Weber ................. G06F 12/0866
                                                       711/113
5,717,892 A    2/1998 Oldfield
(Continued)

FOREIGN PATENT DOCUMENTS

JP    02-168323 A    6/1990
JP    02-302851 A    12/1990
(Continued)

OTHER PUBLICATIONS

Japanese Notice of Reasons for Refusal issued in Japanese Patent Application No. 2016-249062, dated Mar. 24, 2020, with English translation.

*Primary Examiner* — Mushfique Siddique
(74) *Attorney, Agent, or Firm* — McDermott Will & Emery LLP

(57) ABSTRACT

A cache memory device includes: data memory that stores cache data corresponding to data in main memory; tag memory that stores tag information to identify the cache data; an address estimation unit that estimates a look-ahead address to be accessed next; a cache hit determination unit that performs cache hit determination on the look-ahead address, based on the stored tag information; and an access controller that accesses the data memory or the main memory based on the retained cache hit determination result in response to a next access.

9 Claims, 26 Drawing Sheets

(51) Int. Cl.
  *G06F 12/0862* (2016.01)
  *G11C 7/06* (2006.01)
  *G11C 11/4093* (2006.01)
  *G11C 11/4091* (2006.01)

(56) References Cited

U.S. PATENT DOCUMENTS

| | | | | |
|---|---|---|---|---|
| 5,765,190 A * | 6/1998 | Circello | ............ | G06F 12/0837 |
| | | | | 711/118 |
| 6,189,068 B1 * | 2/2001 | Witt | ............ | G06F 9/3004 |
| | | | | 711/118 |
| 7,487,296 B1 * | 2/2009 | Iacobovici | ............ | G06F 12/0862 |
| | | | | 711/137 |
| 2002/0161976 A1 * | 10/2002 | Ito | ............ | G06F 12/0855 |
| | | | | 711/128 |
| 2005/0027921 A1 * | 2/2005 | Hirotsu | ............ | G06F 9/3814 |
| | | | | 711/1 |
| 2005/0086435 A1 * | 4/2005 | Todoroki | ............ | G06F 12/0862 |
| | | | | 711/128 |
| 2008/0098174 A1 * | 4/2008 | Chiba | ............ | G06F 12/0855 |
| | | | | 711/118 |
| 2011/0072215 A1 * | 3/2011 | Takahashi | ............ | G06F 9/325 |
| | | | | 711/125 |
| 2011/0107034 A1 * | 5/2011 | Tanaka | ............ | G06F 12/0862 |
| | | | | 711/144 |
| 2012/0072702 A1 * | 3/2012 | Pierson | ............ | G06F 12/0862 |
| | | | | 712/207 |
| 2015/0293850 A1 * | 10/2015 | Shindo | ............ | G06F 12/0862 |
| | | | | 711/137 |

FOREIGN PATENT DOCUMENTS

| | | |
|---|---|---|
| JP | 05-181748 A | 7/1993 |
| JP | 08-221324 A | 8/1996 |

* cited by examiner

FIG. 3

ACCESS OPERATION ACCORDING TO THE FIRST IMPLEMENTATION EXAMPLE

| | TAG MEMORY (ACCESS ACCEPTED) | DATA MEMORY | ACCESS TO MAIN MEMORY | READ CYCLE |
|---|---|---|---|---|
| CACHE HIT | ○ | ○ | × | +1 |
| CACHE MISS | ○ | × | ○ | +1 |

→ PERFORMANCE DEGRADATION

○ : ACCESS GAINED
× : NO ACCESS GAINED

FIG. 6

ACCESS OPERATION ACCORDING TO THE SECOND IMPLEMENTATION EXAMPLE

| | TAG MEMORY (ACCESS ACCEPTED) | DATA MEMORY | ACCESS TO MAIN MEMORY | READ CYCLE |
|---|---|---|---|---|
| CACHE HIT | ◯ | ◯ | × | 0 |
| CACHE MISS | ◯ | ◯ | ◯ | +1 |

USELESS ACCESS

PERFORMANCE DEGRADATION

◯ : ACCESS GAINED
× : NO ACCESS GAINED

FIG. 14

ACCESS OPERATION ACCORDING TO THE FIRST EMBODIMENT
(DIRECT-MAP SCHEME)

| | TAG MEMORY (LOOK-AHEAD) | TAG MEMORY (ACCESS ACCEPTED) | DATA MEMORY | ACCESS TO MAIN MEMORY | READ CYCLE |
|---|---|---|---|---|---|
| SUCCESSFUL TAG LOOK-AHEAD LOOK-AHEAD CACHE HIT | ○ | × | ○ | × | 0 |
| SUCCESSFUL TAG LOOK-AHEAD LOOK-AHEAD CACHE MISS | ○ | × | × | ○ | 0 |
| UNSUCCESSFUL TAG LOOK-AHEAD CACHE HIT | ○ | ○ | ○ | × | 0 |
| UNSUCCESSFUL TAG LOOK-AHEAD CACHE MISS | ○ | ○ | ○ | ○ | +1 |

NOT ACCESSING DATA MEMORY

○ : ACCESS GAINED
× : NO ACCESS GAINED

FIG. 15

ACCESS OPERATION ACCORDING TO THE FIRST EMBODIMENT
(SET-ASSOCIATIVE SCHEME)

| | TAG MEMORY (LOOK-AHEAD) | TAG MEMORY (ACCESS ACCEPTED) | DATA MEMORY (n way) | ACCESS TO MAIN MEMORY | READ CYCLE |
|---|---|---|---|---|---|
| SUCCESSFUL TAG LOOK-AHEAD LOOK-AHEAD CACHE HIT | ○ | × | ○ | × | 0 |
| SUCCESSFUL TAG LOOK-AHEAD LOOK-AHEAD CACHE MISS | ○ | × | × | ○ | 0 |
| UNSUCCESSFUL TAG LOOK-AHEAD CACHE HIT | ○ | ○ | ○×n | × | 0 |
| UNSUCCESSFUL TAG LOOK-AHEAD CACHE MISS | ○ | ○ | ○×n | ○ | +1 |

READ ACCESS TO ONLY NECESSARY way

○ : ACCESS GAINED
× : NO ACCESS GAINED

CACHE MEMORY DEVICE WITH ACCESS CONTROLLER THAT ACCESSES ONE OF DATA MEMORY AND MAIN MEMORY BASED ON RETAINED CACHE HIT DETERMINATION RESULT IN RESPONSE TO NEXT ACCESS

CROSS-REFERENCE TO RELATED APPLICATIONS

The disclosure of Japanese Patent Application No. 2016-249062 filed on Dec. 22, 2016 including the specification, drawings and abstract is incorporated herein by reference in its entirety.

BACKGROUND

The present invention relates to a cache memory device and a semiconductor device and more particularly to a cache memory device and a semiconductor device including data memory and tag memory, for example.

Cache memory is used to accelerate access to main memory (main storage unit) from a master (master unit) such as CPU (Central Processing Unit). The cache memory is used for many semiconductor devices such as microcomputers along with acceleration of CPUs.

The cache memory is placed between the accessing master and the main memory to be accessed. In order to accelerate the memory access, the cache memory has the function that records an address and accessed content of the main memory accessed by the master and returns the accessed data to the master without accessing the main memory when the same address is accessed next time. Patent literature 1 is known as a related art.

Patent Literature 1: Japanese Unexamined Patent Application Publication No. Hei 5 (1993)-181748

SUMMARY

To embody the above-mentioned function, the cache memory associated with patent literature 1 includes data memory to store part of the main memory and tag memory to store information about whether the data memory retains main memory data. For example, the cache memory can be accelerated by using low-speed DRAM (Dynamic Random Access Memory) for the main memory and high-speed SRAM (Static Random Access Memory) or FF (Flip Flop) for the data memory and the tag memory. The use of the tag memory for cache hit determination can eliminate unnecessary access.

However, the inventors found that the related art can hardly improve the cache memory performance.

These and other objects and novel features may be readily ascertained by referring to the following description of the present specification and appended drawings.

A cache memory device according to an embodiment includes: data memory to store cache data corresponding to data in main memory; and tag memory to store tag information that identifies cache data. The cache memory device estimates a look-ahead address to be accessed next and performs cache hit determination on the estimated look-ahead address based on the tag information stored in the tag memory. The cache memory device retains a cache hit determination result of the look-ahead address. When a next access occurs, the cache memory device accesses the data memory of the main memory based on the retained cache hit determination result.

The above-mentioned embodiment can improve the cache memory performance.

BRIEF DESCRIPTION OF THE DRAWINGS

FIG. 3 is a table illustrating access operation of the cache memory according to the first implementation example;

FIG. 6 is a table illustrating access operation of the cache memory according to the second implementation example;

FIG. 14 is a table illustrating access operation of the cache memory according to the first embodiment;

FIG. 15 is a table illustrating access operation of the cache memory according to the first embodiment;

DETAILED DESCRIPTION

Figure 1:
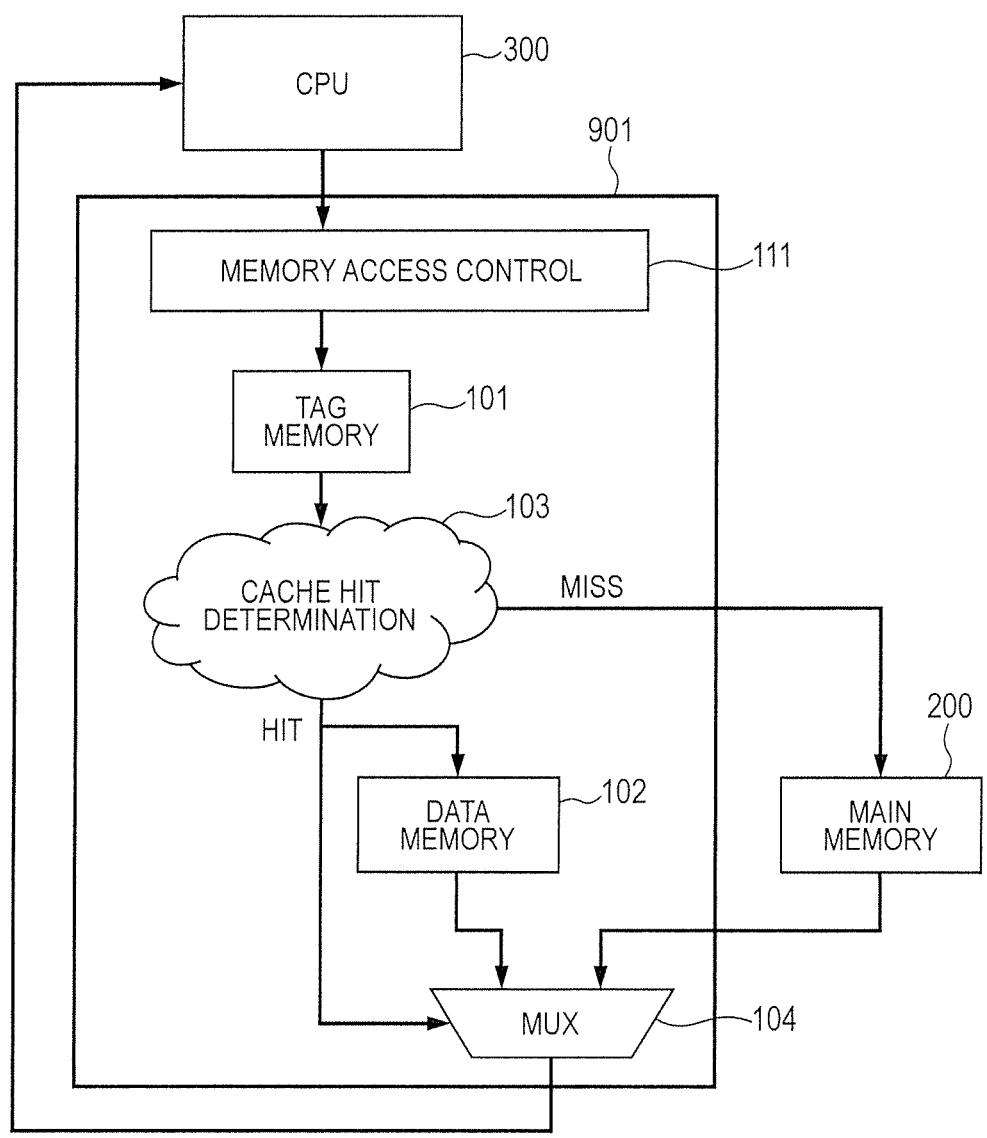
FIG. 1 is a configuration diagram illustrating a configuration of cache memory according to a first implementation example.

The following description and drawings are omitted and simplified as needed in order to clarify the explanation. Components illustrated in the drawings as function blocks to perform various processes can be configured as hardware by using a CPU, memory, and other circuits and can be provided as software by a program loaded into the memory. It is therefore understood by those skilled in the art that the function blocks can be embodied as hardware only, software only, or combinations of these, and are not limited thereto. In the drawings, Emutually corresponding elements are designated by the same reference symbols and a duplicate explanation is omitted as needed.

Examination Before Application of Embodiments

The description below examines a first implementation example and a second implementation example before application of embodiments.

<First Implementation Example>

FIG. 1 illustrates a configuration of cache memory according to the first implementation example. As illustrated in FIG. 1, cache memory 901 according to the first implementation example includes tag memory 101, data memory 102, a cache hit determination circuit 103, an MUX (multiplexer) 104, and a memory access controller 111. The cache memory 901 is placed (coupled) between a CPU 300 and main memory 200 and fast responds to an access request (read access or write access) from the CPU 300.

The data memory 102 temporarily stores part of read data (cache data) stored in the main memory 200. The tag memory 101 stores an address (tag information representing the presence or absence of caching) in the main memory 200 corresponding to data stored in the data memory 102. As above, the main memory 200 generally uses low-speed memory (such as DRAM) and the tag memory 101 and the data memory 102 use high-speed memory (such as SRAM and FF). In this example, the tag memory 101 and the data memory 102 use SRAM.

The cache hit determination circuit 103 performs cache hit determination by using read data read from the tag memory 101. Based on the tag information stored in tag memory 101, the cache hit determination circuit 103 performs the cache hit determination (cache hit or cache miss) to determine whether the data memory 102 stores data corresponding to the address accessed by the CPU 300. The MUX 104 selects data in the data memory 102 or the main memory 200 based on a cache hit determination result from the cache hit determination circuit 103 and outputs the selected data to the CPU 300.

The memory access controller 111 controls access (read access or write access) to each memory. The memory access controller 111 may control access to all or part of the memory units. In FIG. 1, for example, the memory access controller 111 may control access to the tag memory 101, the data memory 102, and the main memory 200. The memory access controller 111 may control access to the tag memory 101. The cache hit determination circuit 103 may control access to the data memory 102 and the main memory 200. The same applies to the second implementation example and embodiments to be described later.

Figure 2:
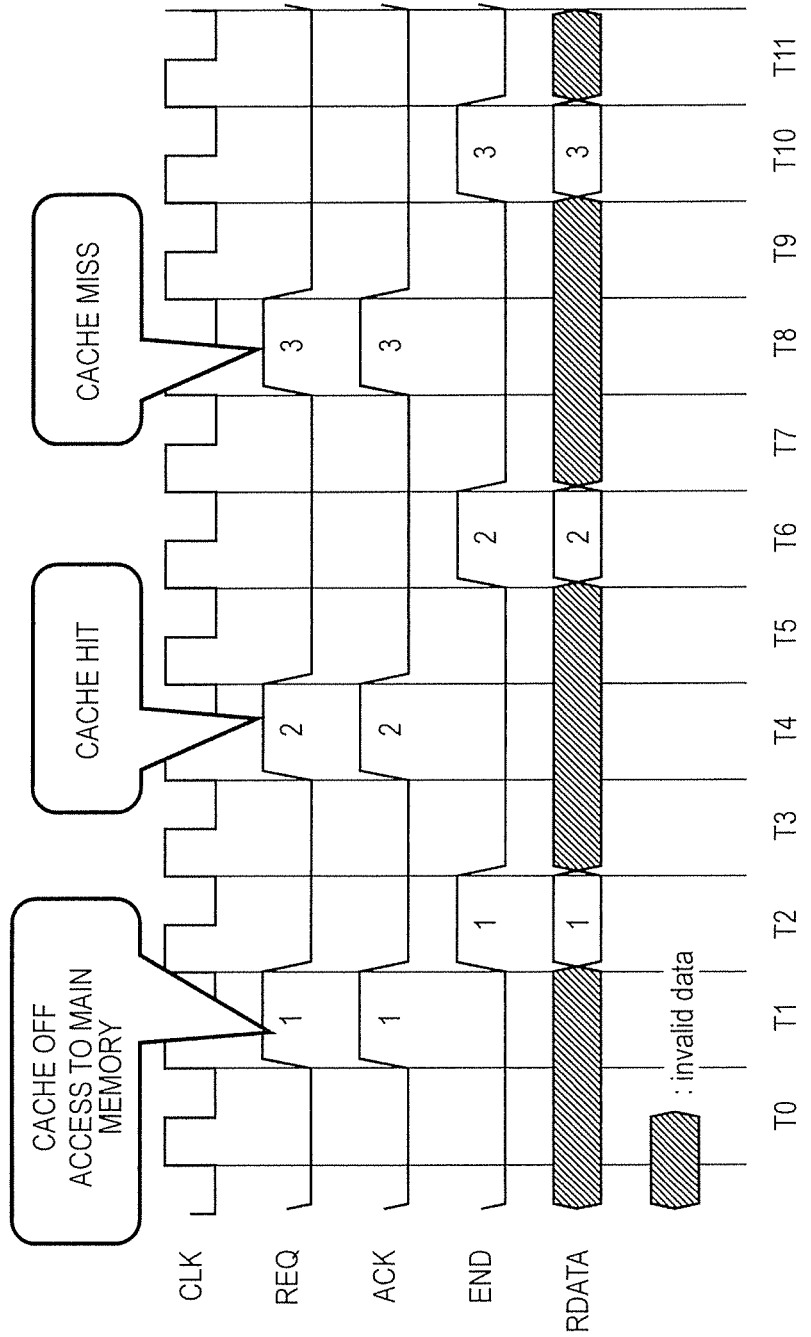
FIG. 2 is a timing chart illustrating operation of the cache memory according to the first implementation example.

FIG. 2 illustrates operation timings for the cache memory 901 according to the first implementation example. Clock cycles T1 and T2 represent cache off operation (before data caching) that does not use the cache memory. Clock cycles T4 through T6 represent cache hit operation after data caching. Clock cycles T8 through T10 represent cache miss operation after data caching.

As a cache off operation, the CPU 300 outputs read request REQ (read access) at clock cycle T1. The memory access controller 111 then outputs an ACK signal (access acceptance response) to the CPU 300. At the next clock cycle T2, the memory access controller 111 accesses the main memory 200. The main memory 200 outputs read data RDATA and an END signal (access completion) to the CPU 300. The memory access controller 111 registers and updates information (data and address) accessed in the tag memory 101 and the data memory 102.

As a cache hit operation, the CPU 300 outputs read request REQ at clock cycle T4. The memory access controller 111 outputs an ACK signal to the CPU 300. At the next clock cycle T5, the memory access controller 111 accesses the tag memory 101. Based on the read data in the tag memory 101, the cache hit determination circuit 103 determines (cache hit determination) whether the data memory 102 (cache memory) includes the information about the accessed main memory 200.

At the next clock cycle T6, the cache hit determination circuit 103 (or memory access controller 111) accesses the data memory 102 if the data memory 102 includes the accessed information (cache hit). The MUX 104 selects output of the data memory 102. The data memory 102 outputs read data RDATA and the END signal to the CPU 300.

During the cache miss operation, an ACK signal is output in response to read request REQ from the CPU 300 at clock cycle T8 similarly to clock cycles T4 and T5. The tag memory 101 is accessed at clock cycle T9. The cache hit determination circuit 103 performs the cache hit determination. At the next clock cycle T10, the cache hit determination circuit 103 (or the memory access controller 111) accesses the main memory 200 if the data memory 102 does not store the accessed information (cache miss). The MUX 104 selects output of the main memory 200. The main memory 200 outputs read data RDATA and the END signal to the CPU 300. The memory access controller 111 registers and updates the information accessed in the tag memory 101 and the data memory 102.

FIG. 3 illustrates an overview of the cache memory access operation according to the first implementation example. The first implementation example accesses the data memory 102 at the time of cache hit and accesses the main memory 200 at the time of cache miss. The first implementation example eliminates unnecessary data memory access because the data memory 102 is not accessed when the cache memory 901 does not store the information about the main memory 200. A set-associative scheme allows the data memory 102 to include a plurality of ways and, when a cache hit occurs, can perform read access to only ways for the data memory 102 that registers read data.

However, the first implementation example accesses the tag memory 101, performs the cache hit determination, and then (at the cycle next to the tag memory access) accesses the data memory 102 of the main memory 200. Another read cycle is required additionally regardless of cache miss or cache hit and the performance therefore degrades.

<Second Implementation Example>

Figure 4:
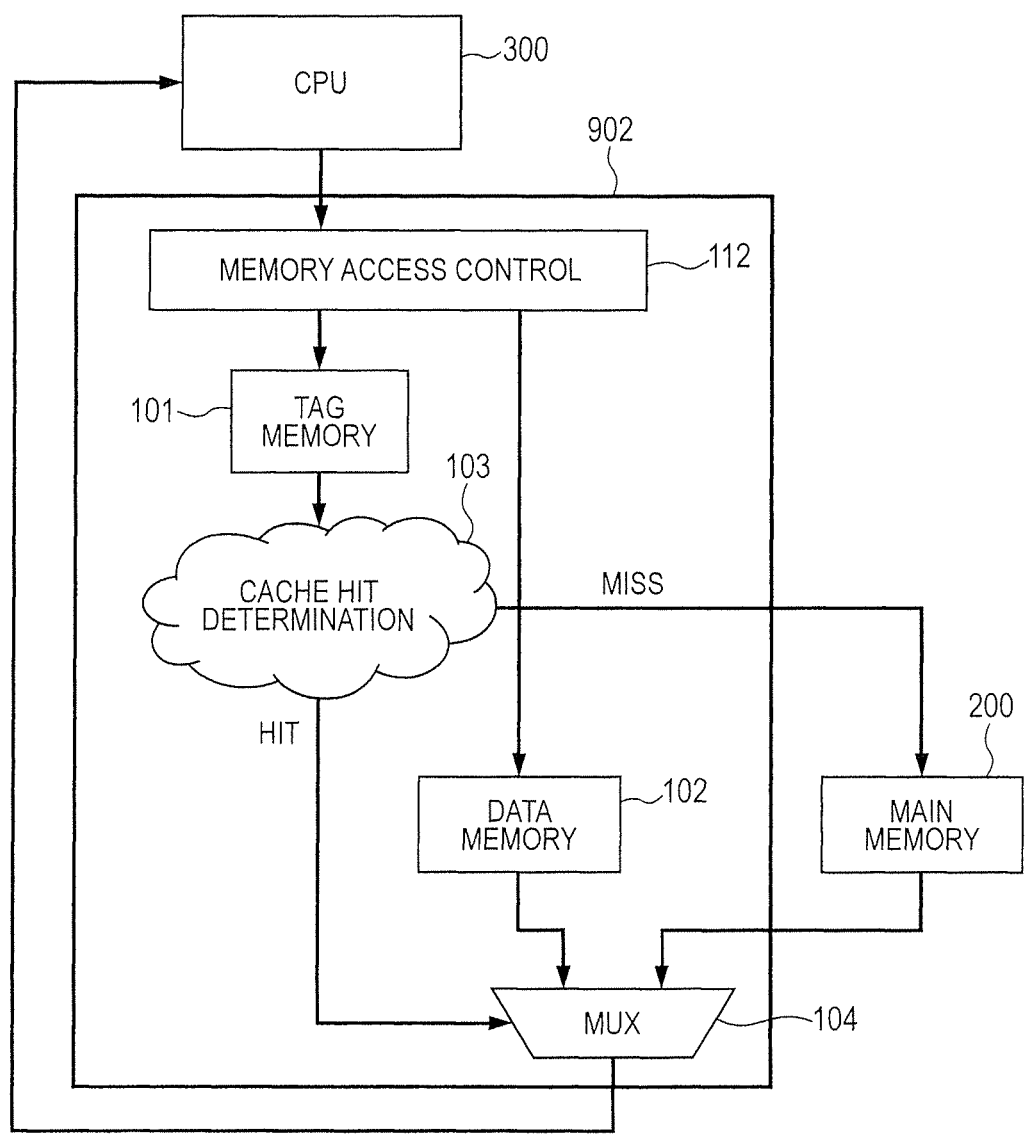
FIG. 4 is a configuration diagram illustrating a configuration of cache memory according to a second implementation example.

FIG. 4 illustrates a cache memory configuration according to the second implementation example. The second implementation example improves the performance degradation in the first implementation example.

As illustrated in FIG. 4, cache memory 902 according to the second implementation example, like the first implementation example, includes the tag memory 101, the data memory 102, the cache hit determination circuit 103, the MUX 104, and a memory access controller 112. In the second implementation example, the memory access controller 112 simultaneously accesses the tag memory 101 and the data memory 102.

Figure 5:
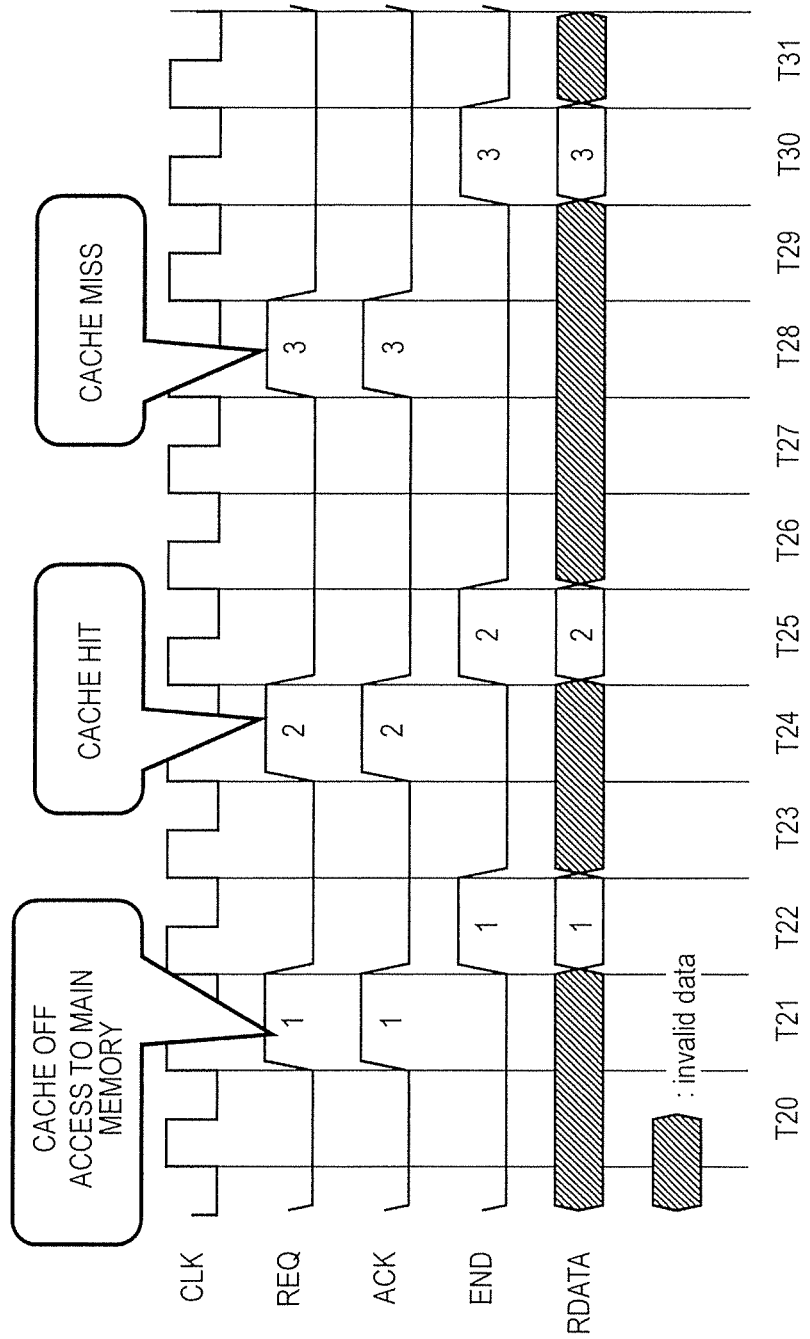
FIG. 5 is a timing chart illustrating operation of the cache memory according to the second implementation example.

FIG. 5 illustrates operation timings for the cache memory 902 according to the second implementation example. Clock cycles T21 and T22 represent cache off operation. Clock cycles T24 and T25 represent cache hit operation. Clock cycles T28 through T30 represent cache miss operation.

A cache off operation corresponds to clock cycles T1 and T2 in the first implementation example. At clock cycle T21, the memory access controller 112 outputs an ACK signal in response to read request REQ from the CPU 300. At clock cycle T22, the main memory 200 is accessed to output read data RDATA and an END signal to the CPU 300.

As a cache hit operation, the CPU 300 outputs read request REQ at clock cycle T24. The memory access controller 112 then outputs an ACK signal to the CPU 300. At the next clock cycle T25, the memory access controller 112 accesses the tag memory 101 and the data memory 102. The cache hit determination circuit 103 performs the cache hit determination based on the read data in the tag memory 101. At clock cycle T25 during the cache hit, read data RDATA and the END signal are output from the already accessed data memory 102 to the CPU 300.

As a cache miss operation, an ACK signal is output in response to read request REQ from the CPU 300 at clock cycle T28 similarly to clock cycles T24 and T25. At clock cycle T29, the tag memory 101 and the data memory 102 are accessed. The cache hit determination circuit 103 performs the cache hit determination. At the next clock cycle T30 during the cache miss, the cache hit determination circuit 103 (or the memory access controller 112) accesses the main memory 200. The main memory 200 outputs read data RDATA and the END signal to the CPU 300.

FIG. 6 illustrates an overview of access operation of the cache memory according to the second implementation example. When an access occurs, the second implementation example accesses the data memory 102 simultaneously with access to the tag memory 101. Read data in the data memory 102 is output to the master or the main memory 200 is accessed depending on a result from the cache hit determination. The second implementation example simultaneously accesses the tag memory 101 and the data memory 102 and can therefore directly output the read data to the master when a cache hit occurs. It is therefore possible to improve the performance when a cache hit occurs. When a cache miss occurs, however, even the second implementation example wastes an access to the data memory 102, requires an extra read cycle, and degrades the performance.

There may be a technique of using patent literature 1 to improve a cache hit ratio. When a cache miss occurs, the technique reads read data from the main memory, returns the read data to the CPU, and simultaneously performs the cache hit determination on an address expected to be accessed next. When a cache miss occurs, the technique performs read access to the main memory and previously registers the result to the cache to improve the cache hit ratio.

When a cache hit occurs, however, even this technique cannot improve the cache hit ratio for an access next to the cache hit. Suppose an access next to the cache miss is targeted at an address other than the expected address. In this case, the technique wastes the operation that looks ahead the tag information, reads read data from the main memory, and registers the read data to the data memory.

As above, the first implementation example degrades the performance when a cache hit or a cache miss occurs. The second implementation example wastes an access to the data memory and degrades the performance when a cache miss occurs. Further, the second implementation example needs to access all the ways included in the data memory according to the set-associative scheme.

The technology according to patent literature 1 does not change the cache hit ratio for an access next to the cache hit and wastes the operation of main memory access and registration to the cache when an access next to the cache miss is targeted at an address other than the expected address.

Embodiment Overview

Figure 7:
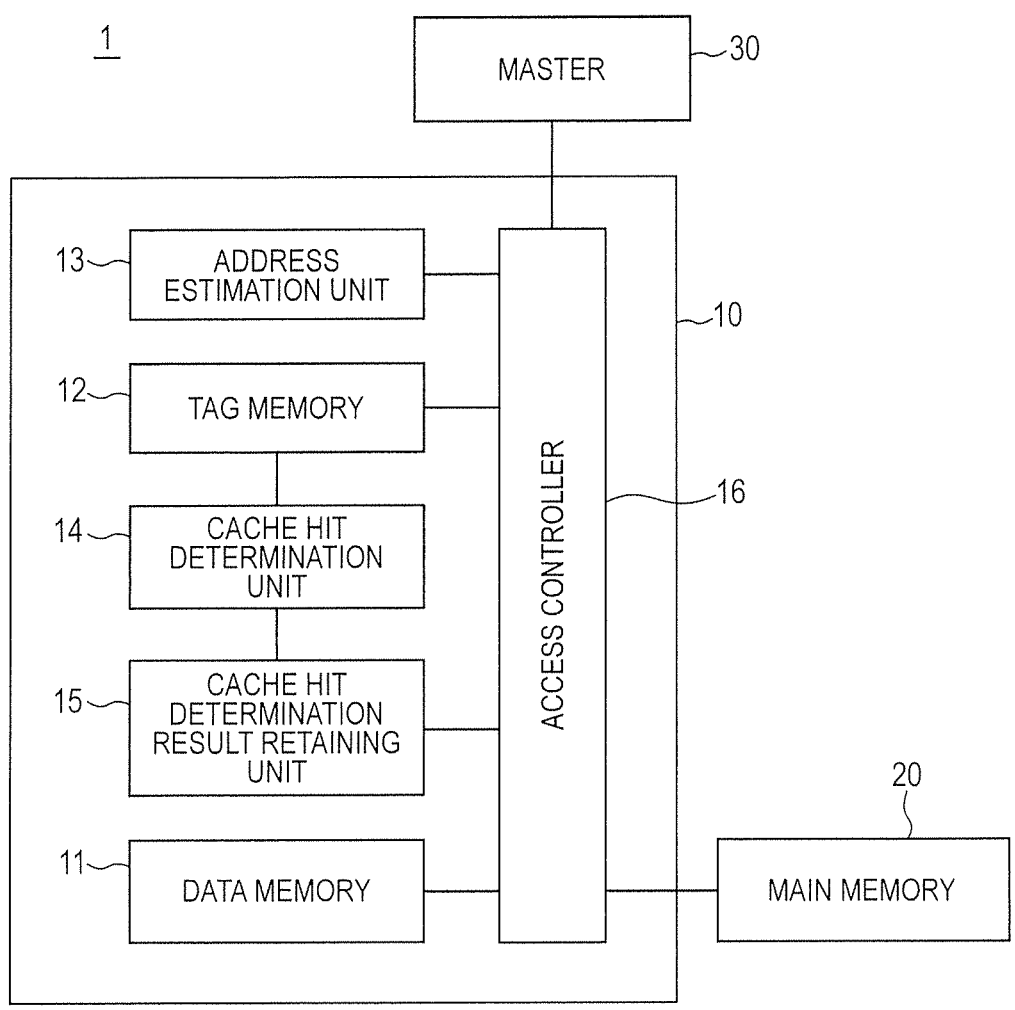
FIG. 7 is a configuration diagram illustrating a schematic configuration of a cache memory device according to an embodiment.

FIG. 7 illustrates a schematic configuration of a cache memory device according to the embodiment described below. As illustrated in FIG. 7, a cache memory device 10 according to the embodiment includes data memory 11, tag memory 12, an address estimation unit 13, a cache hit determination unit 14, a cache hit determination result retention unit 15, and an access controller 16. A semiconductor device 1 includes the cache memory device 10, main memory 20, and a master 30, for example.

The data memory 11 stores cache data corresponding to data in the main memory 20. The tag memory 12 stores tag information to identify cache data in the data memory 11. The address estimation unit 13 estimates a look-ahead address to be accessed next from the master 30.

The cache hit determination unit 14 performs the cache hit determination on a look-ahead address estimated by the address estimation unit 13 based on tag information in the tag memory 12. The cache hit determination result retention unit 15 retains a result of the cache hit determination performed by the cache hit determination unit 14 on the look-ahead address. When accessed by the master 30 next, the access controller 16 accesses the data memory 11 or the main memory 20 based on a cache hit determination result retained in the cache hit determination result retention unit 15. For example, the access controller 16 accesses the data memory 11 when the retained cache hit determination result indicates a cache hit. The access controller 16 accesses the main memory 20 when the retained cache hit determination result indicates a cache miss. The access controller 16 may control access to the data memory 11, the main memory 20, and the tag memory 12.

As above, a look-ahead address for the next access is previously estimated and a cache hit determination result for the look-ahead address is retained (referred to as tag look-ahead). At the next access, the data memory or the main memory is accessed based on the retained cache hit determination result without accessing the tag memory. The tag look-ahead can omit the cache hit determination using the tag memory at the next access and can therefore accelerate accesses, prevent an unnecessary access, and improve the performance.

FIG. 7 provides a configuration example of the cache memory device 10 according to the embodiment. Part of the configuration or the control in the cache memory may be provided outside as illustrated in FIGS. 8 and 9.

Figure 8:
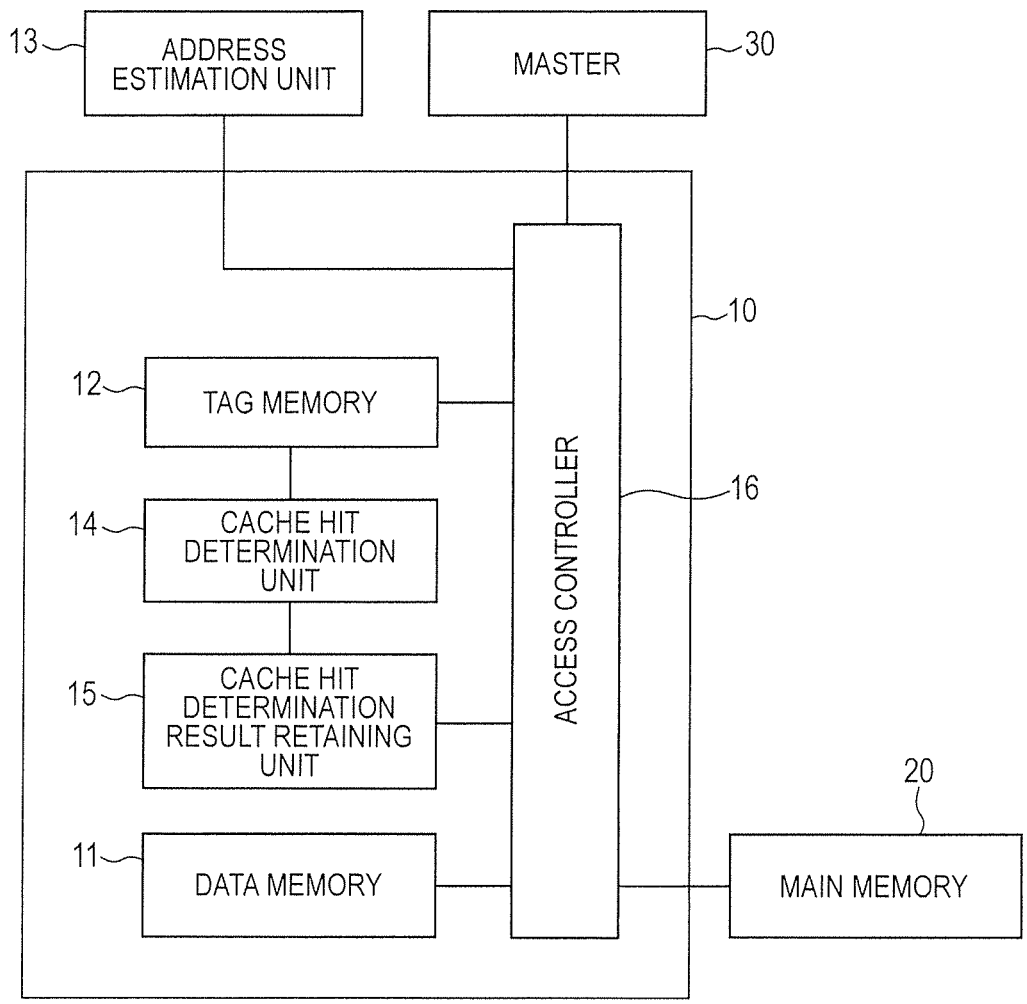
FIG. 8 is a configuration diagram illustrating another configuration example of the cache memory device according to the embodiment.

FIG. 8 provides another configuration example of the cache memory device according to the embodiment. The example in FIG. 8 provides the address estimation unit 13 outside the cache memory device 10. Namely, the semiconductor device 1 includes the cache memory device 10, the main memory 20, the master 30, and the address estimation unit 13. The cache memory device 10 includes the data memory 11, the tag memory 12, the cache hit determination unit 14, the cache hit determination result retention unit 15, and the access controller 16.

The above-mentioned example in FIG. 7 estimates an address to be accessed next in the cache memory device 10 and generates an address for the tag look-ahead. Contrastingly, the example in FIG. 8 receives an address to perform the tag look-ahead from outside the cache memory device 10 and performs the tag look-ahead by using the address. This example is characterized by being supplied with an address for the tag look-ahead from outside, not generating the address in the cache memory device. This configuration is useful for a module that performs branch estimation outside the cache memory device. Efficient tag look-ahead is made available by acquiring an address for the next branch destination from the module.

Figure 9:
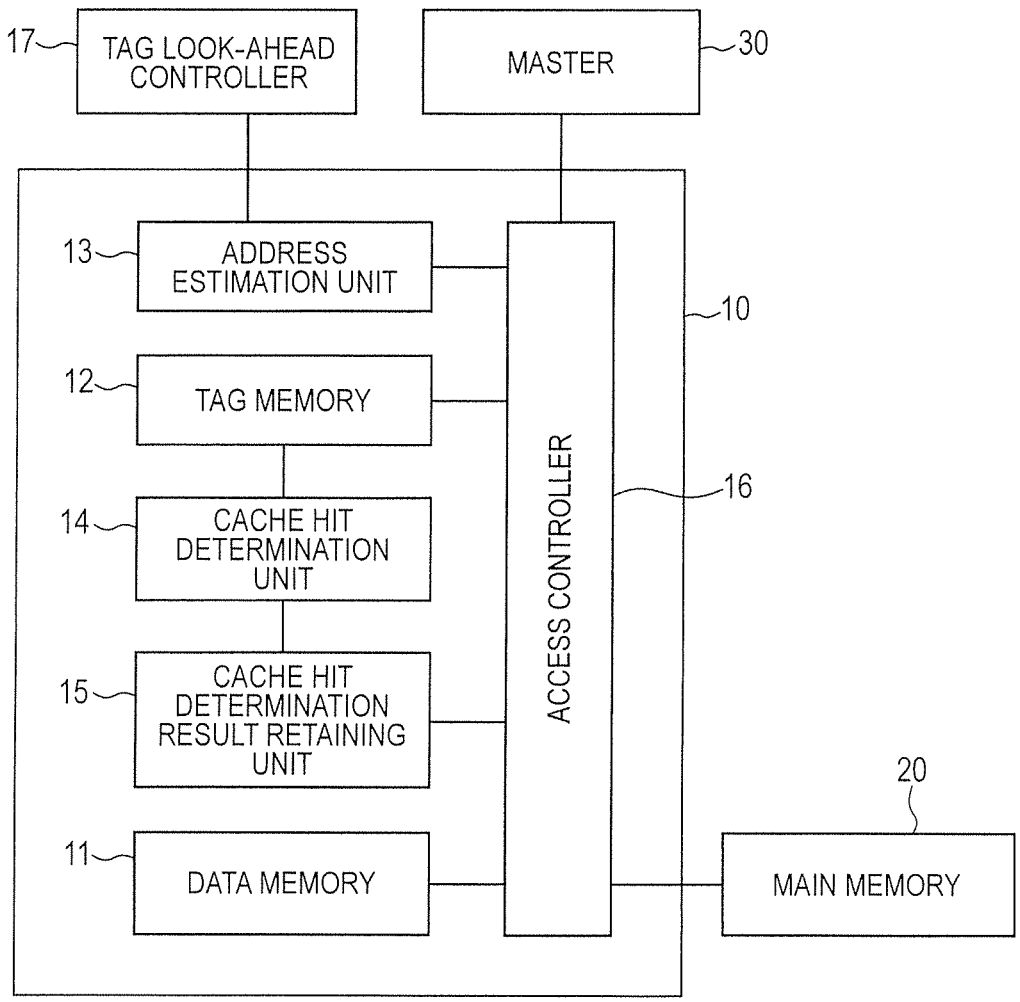
FIG. 9 is a configuration diagram illustrating yet another configuration example of the cache memory device according to the embodiment.

FIG. 9 illustrates still another configuration example of the cache memory device according to the embodiment. The example of FIG. 9 provides a tag look-ahead controller outside the cache memory device. Namely, the semiconductor device 1 includes the cache memory device 10, the main memory 20, the master 30, and a tag look-ahead controller 17. The cache memory device 10 is configured similarly to FIG. 7. The tag look-ahead controller 17 controls tag look-ahead operation (such as estimating a look-ahead address and retaining a result of the cache hit determination on the look-ahead address) of the cache memory device 10.

The example in FIG. 9 receives a signal from outside the cache memory device while the signal controls whether to perform the tag look-ahead. There is provided a control whether to perform the tag look-ahead, based on the control signal. The above-mentioned example in FIG. 7 determines in the cache memory device whether to perform the tag look-ahead. Based on a result, the example controls whether to perform the tag look-ahead.

The example of FIG. 9 is characterized by the function of controlling whether to perform the tag look-ahead using the signal input from outside. This configuration can eliminate wasteful tag look-ahead. For example, it is possible to provide control to determine consecutiveness of addresses outside the cache memory device and perform the tag look-ahead only when the addresses are consecutive.

First Embodiment

The description below explains the first embodiment with reference to the accompanying drawings.

Figure 10:
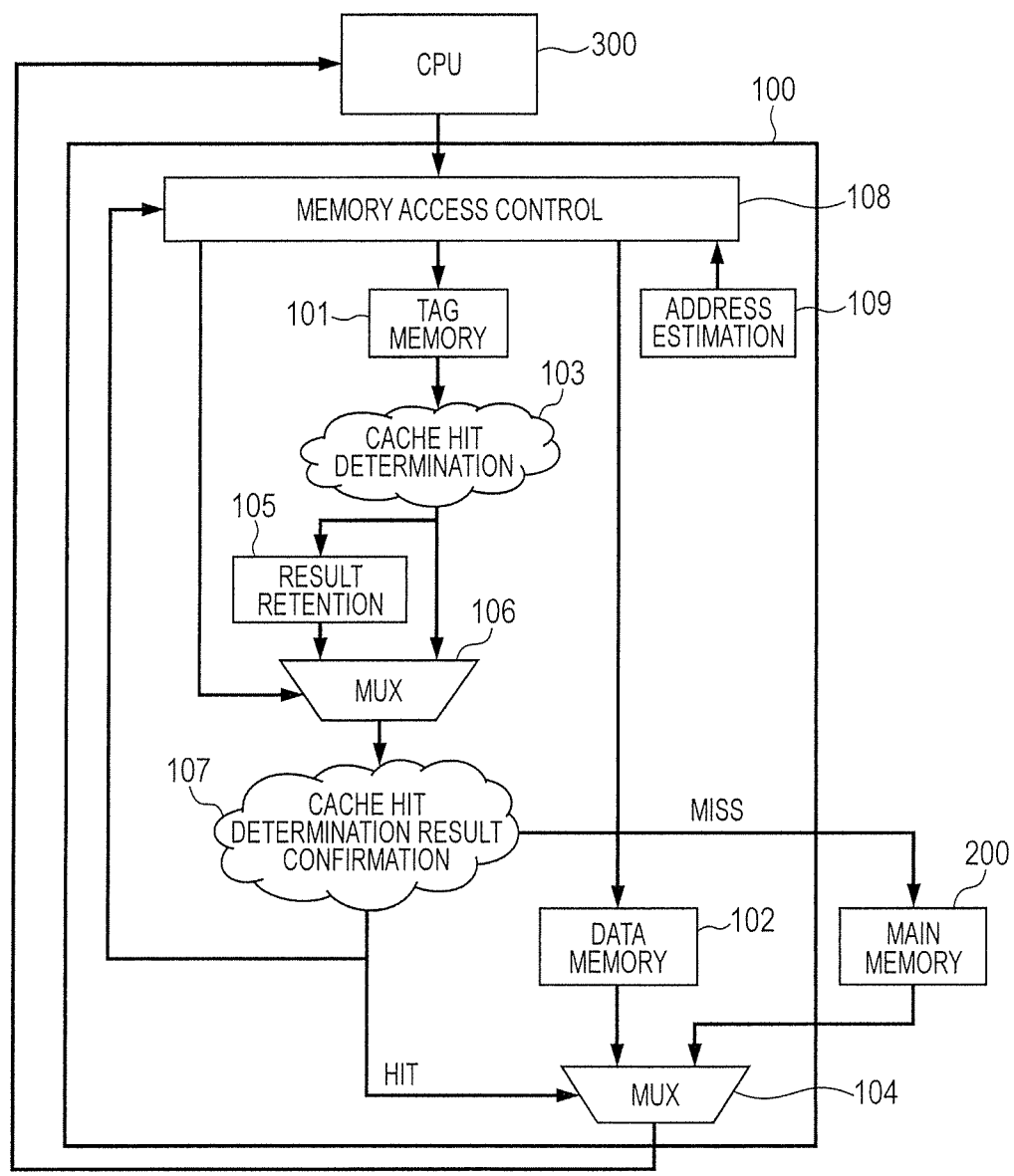
FIG. 10 is a configuration diagram illustrating a configuration of the cache memory according to a first embodiment.

FIG. 10 illustrates a configuration example of the cache memory according to the embodiment. As illustrated in FIG. 10, cache memory 100 according to the present embodiment includes the tag memory 101, the data memory 102, the cache hit determination circuit 103, the MUX 104, a memory access controller 108 similarly to the first and second implementation examples. The cache memory 100 also includes a result retention circuit 105, an MUX 106, a cache hit determination result continuation circuit 107, and an address estimation unit 109. The tag memory 101 and the data memory 102 use SRAM similarly to the first and second implementation examples. For example, SRAM uses one clock cycle for an access cycle. The tag look-ahead is performed to be able to accelerate the access rate by the clock cycle.

The address estimation unit 109 estimates an address (look-ahead address) to be accessed next from the CPU 300. The present embodiment simplifies the circuitry and therefore allows the address estimation unit 109 to estimate an address (next address or incremented address) contiguous with the most recently accessed address. A more accurate address estimation method may be used. It may be possible to use an address estimated based on data about the currently accessed address (an address to be accessed next based on an instruction), for example.

The memory access controller 108 according to the present embodiment accesses the tag memory 101 (tag look-ahead) by using the address for the next estimated access in addition to the address corresponding to an access from the CPU 300. The memory access controller 108 (or the address estimation unit 109) retains the estimated look-ahead address and determines (tag look-ahead determination) whether the look-ahead address matches the address for the current access when the next access occurs. The memory access controller 108 accesses the data memory 102 or the main memory 200 based on this tag look-ahead determination result and the cache hit determination result (e.g., successful tag look-ahead (matched)) retained in the result retention circuit 105 concerning the look-ahead address. This eliminates access to the tag memory 101 and makes fast access available.

If the tag look-ahead is unsuccessful (unmatched), the cache hit determination is performed and the data memory 102 or the main memory 200 is accessed based on the determination result. In this case, similarly to the second implementation example, the tag memory 101 and the main memory 200 may be accessed and the main memory 200 may be accessed (or data memory output) based on a cache hit determination result. This can provide the performance comparable to the second implementation example even if the tag look-ahead is unsuccessful.

The memory access controller 108 moreover includes a function that can access only the tag memory 101, only the data memory 102, or the tag memory 101 and the data memory 102 by using a cache hit determination result or information about the accepted access.

The cache hit determination circuit 103 performs the cache hit determination on an address accessed from the CPU 300 and performs the cache hit determination on the previously estimated look-ahead address. The result retention circuit (cache hit determination result retention circuit) 105 retains a cache hit determination result by using the previously estimated look-ahead address.

The MUX 106 selects data for the cache hit determination circuit 103 or the result retention circuit 105 based on control from the memory access controller 108 and outputs the data to the cache hit determination result continuation circuit 107. The MUX 106 selects the result retention circuit 105 when the operation requires confirming a cache hit determination result for the previously estimated look-ahead address. The MUX 106 selects the cache hit determination circuit 103 when the operation requires confirming a cache hit determination result for the current address. The cache hit determination result confirmation circuit 107 selects access to or output from the data memory 102 or the main memory 200 based on the cache hit determination result for the previously estimated look-ahead address or the cache hit determination result for the current address.

Figure 11:
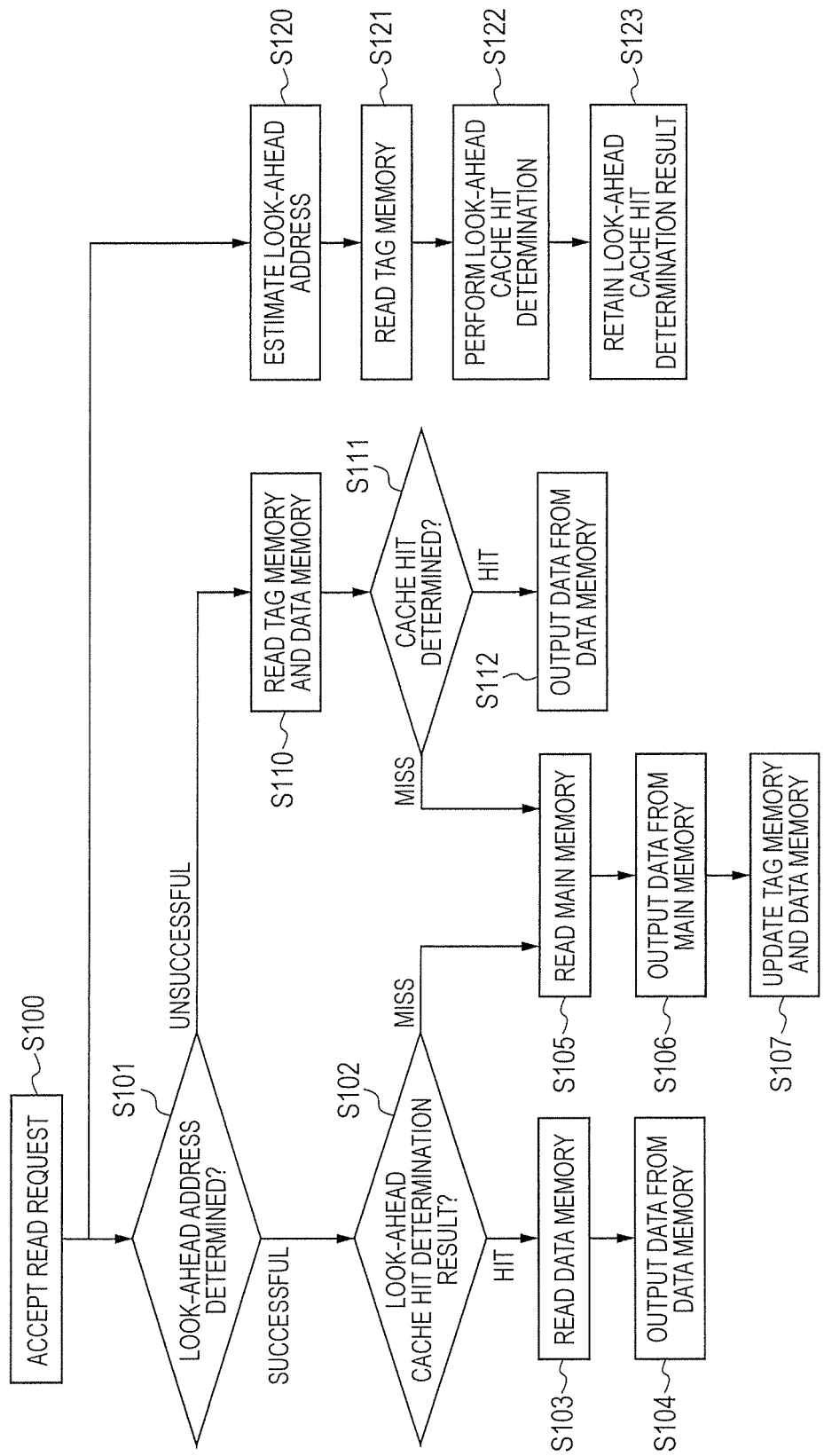
FIG. 11 is a flowchart illustrating an operation example of the cache memory according to the first embodiment.

FIG. 11 illustrates operation of the cache memory according to the present embodiment.

As illustrated in FIG. 11, the tag look-ahead operation (S120 through S123) is performed in advance. Namely, the address estimation unit 109 estimates an address (look-ahead address) to be accessed next (S120). The memory access controller 108 (or the address estimation unit 109) retains the look-ahead address. The memory access controller 108 gains read access to the tag memory 101 by using the estimated look-ahead address (S121). The cache hit determination circuit 103 performs the (look-ahead) cache hit determination by using the read data in the tag memory 101 (S122) and allows the result retention circuit 105 to retain a look-ahead cache hit determination result (S123).

Figure 12:
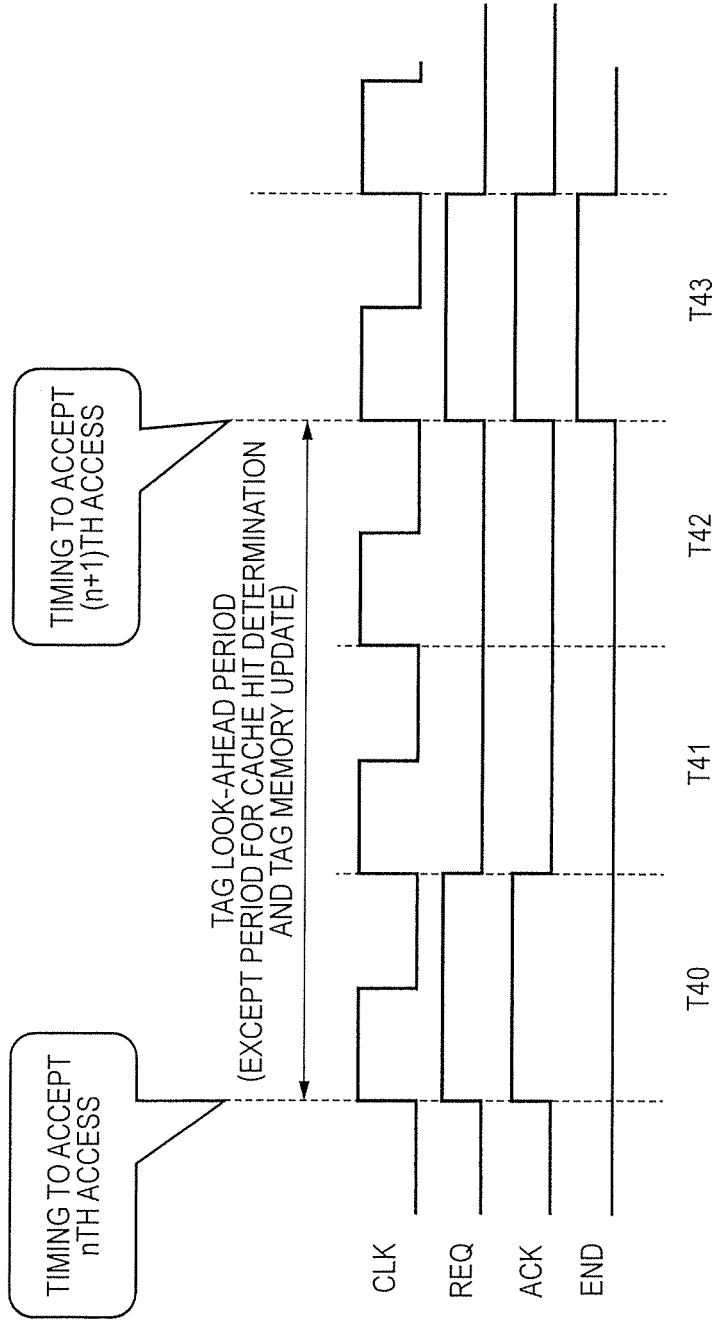
FIG. 12 is a timing chart illustrating operation of the cache memory according to the first embodiment.

FIG. 12 illustrates a tag look-ahead period to perform the tag look-ahead operation at S120 through S123. Timings (tag look-ahead period) as illustrated in FIG. 12 allow the address estimation unit 109 and the memory access controller 108 to estimate an address and performs the tag look-ahead. The period ranges from clock cycle T40 (the beginning of T40) for accepting the most recent (nth) access to one cycle before clock cycle T43 (to the end of clock cycle T42) where the current ((n+1)th) access is accepted. The period excludes the period for the cache hit determination using the tag memory 101 and the period for updating the tag memory 101 (read and write accesses). The address estimation unit 109 and the memory access controller 108 perform the operation at S120 and later during the period except S107, S110, and S111 in FIG. 11, for example.

The next access (read request) is accepted from the CPU 300 (S100). The memory access controller 108 (or the address estimation unit 109) compares the retained look-ahead address with an address of the accepted access and performs the tag look-ahead (S101).

At S101, the look-ahead address may match the accessed address (successful tag look-ahead). In this case, the memory access controller 108 switches the MUX 106 and outputs the retained look-ahead cache hit determination result from the result retention circuit 105. The cache hit determination result confirmation circuit 107 confirms the retained look-ahead cache hit determination result (S102).

At S102, the retained look-ahead cache hit determination result may indicate a cache hit. In this case, the cache hit determination result confirmation circuit 107 (or the memory access controller 108) gains read access to the data memory 102 (S103). The MUX 104 selects output from the data memory 102 and outputs the read data to the CPU 300 from the data memory 102 (S104).

At S102, the retained look-ahead cache hit determination result may indicate a cache miss. In this case, the cache hit determination result confirmation circuit 107 (or the memory access controller 108) gains read access to the main memory 200 (S105). The MUX 104 selects output from the main memory 200 and outputs the read data to the CPU 300 from the main memory 200 (S106). The read data updates the tag memory 101 and the data memory 102 (S107).

At S101, the look-ahead address may differ from the accessed address (unsuccessful tag look-ahead). In this case, the memory access controller 108 gains simultaneous read access to the tag memory 101 and the data memory 102 by using the accessed address (S110). The cache hit determination circuit 103 performs the cache hit determination by using the read data from the tag memory 101 (S111). The memory access controller 108 then switches the MUX 106 to output a cache hit determination result from the cache hit determination circuit 103.

At S111, the cache hit determination on the accessed address may result in a cache hit. In this case, the MUX 104 selects output from the data memory 102 under control of the cache hit determination circuit 103 (or the cache hit determination result confirmation circuit 107) and outputs the read data as is from the accessed data memory 102 (S112).

The same operation as that at S105 through S107 above is performed if the cache hit determination on the accessed address results in a cache miss at S111. Namely, the cache hit determination circuit 103 (the cache hit determination result confirmation circuit 107 or the memory access controller 108) gains read access to the main memory 200 (S105), outputs the read data from the main memory 200 (S106), and updates the tag memory 101 and the data memory 102 (S107).

Figure 13:
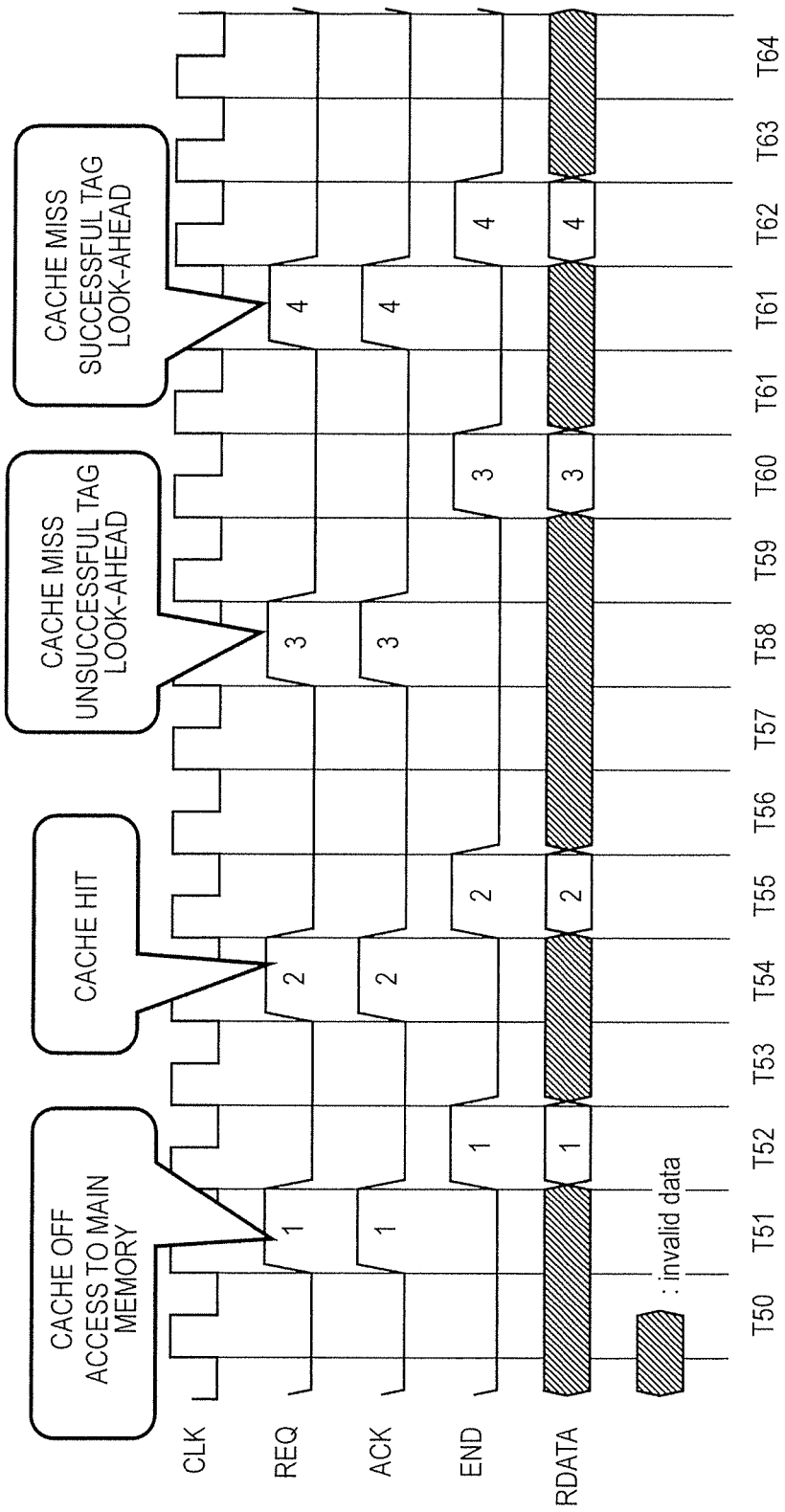
FIG. 13 is a timing chart illustrating operation of the cache memory according to the first embodiment.

FIG. 13 illustrates operation timings of the cache memory according to the present embodiment. Clock cycles T21 and T22 represent cache off operation. Clock cycles T54 and T55 represent cache hit operation (tag look-ahead turned off). Clock cycles T58 through T60 represent cache miss operation and unsuccessful tag look-ahead. Clock cycles T61 and T62 represent cache miss operation and successful tag look-ahead.

The cache off operation is similar to the first implementation example and the second implementation example. At clock cycle T51, the memory access controller 108 outputs an ACK signal in response to read request REQ from the CPU 300. At clock cycle T52, the main memory 200 is accessed to output read data RDATA and the END signal to the CPU 300.

The cache hit operation is similar to the second implementation example. At clock cycle T54, the memory access controller 108 outputs an ACK signal in response to the read request REQ from the CPU 300. At clock cycle T55, the tag memory 101 and the data memory 102 are accessed. The cache hit determination circuit 103 performs the cache hit determination. Read data RDATA and the END signal are output to the CPU 300 from the accessed data memory 102 at clock cycle T55 when a cache hit occurs.

At clock cycle T58 during the operation of cache miss and unsuccessful tag look-ahead, the memory access controller 108 outputs an ACK signal in response to read request REQ from the CPU 300 and confirms whether the address for the read request REQ matches the look-ahead address. At the next clock cycle T59 when the tag look-ahead is unsuccessful (difference between the read request REQ address and the look-ahead address), the memory access controller 108 accesses the tag memory 101 and the data memory 102. The cache hit determination circuit 103 performs the cache hit determination. At the next clock cycle T60 when a cache miss occurs, the memory access controller 108 accesses the main memory 200 and outputs read data RDATA and the END signal to the CPU 300.

At clock cycle T61 during the operation of cache miss and successful tag look-ahead, the CPU 300 outputs read request REQ. The memory access controller 108 then outputs an ACK signal to the CPU 300 and confirms whether the read request REQ address matches the look-ahead address. When the tag look-ahead is successful (match between the read request REQ address and the look-ahead address), the cache hit determination result confirmation circuit 107 confirms the retained look-ahead cache hit determination result. At the next clock cycle T62 when the look-ahead cache hit determination result indicates a cache miss, the memory access controller 108 accesses the main memory 200 and outputs read data RDATA and the END signal to the CPU

300. At the next clock cycle T62 when the look-ahead cache hit determination result indicates a cache hit, the memory access controller 108 similarly accesses the data memory 102 and outputs read data RDATA and the END signal to the CPU 300.

FIGS. 14 and 15 schematically illustrate access operations of the cache memory according to the present embodiment according to a direct-map scheme and a set-associative scheme, respectively.

The present embodiment performs the cache hit determination on the tag memory, estimates the next access address when the tag memory is not updated, previously performs the cache hit determination on the address, and retains the result. When the address of the next accepted access matches (successful tag look-ahead), the present embodiment is characterized by providing a controller or a retention circuit that uses the retained result to confirm a cache hit or a cache miss and implements operation to perform the access control.

The second implementation example simultaneously accesses the tag memory and the data memory and performs the cache hit determination by using read data from the tag memory. When the cache hit determination results in a cache miss, a cycle from accepting the access to outputting data equals the sum of the read cycle of the tag memory and the cycle needed for the read access of the main memory.

Contrastingly, the present embodiment characterized as above can promptly access the main memory when the tag look-ahead is successful and the cache hit determination results in a cache miss. As illustrated in FIG. 14, the present embodiment can therefore eliminate a cycle needed for access to the tag memory from the cycle needed for read data and can prevent an unnecessary access to the data memory.

The cache memory based on the set-associative scheme requires accessing all ways in the data memory according to the second implementation example that simultaneously accesses the tag memory and the data memory. Contrastingly, as illustrated in FIG. 15, the present embodiment can previously retain cache-hit ways and can access only one way in the data memory including read data and therefore save the power consumption.

Patent literature 1 may be used to perform the tag look-ahead only when a cache miss occurs. The present embodiment performs the tag look-ahead also when a cache hit occurs, making it possible to improve the cache hit ratio when a cache miss and a cache hit occur.

An unexpected address may be accessed because only the tag look-ahead is performed. In such a case, the present embodiment does not gain useless read access to the main memory and does not perform caching operation, making it possible to save power consumption.

Second Embodiment

The description below explains the second embodiment with reference to the accompanying drawings. The present embodiment differs from the first embodiment only in the tag look-ahead operation. The basic configuration of the cache memory equals the first embodiment as illustrated in FIG. 10.

Figure 16:
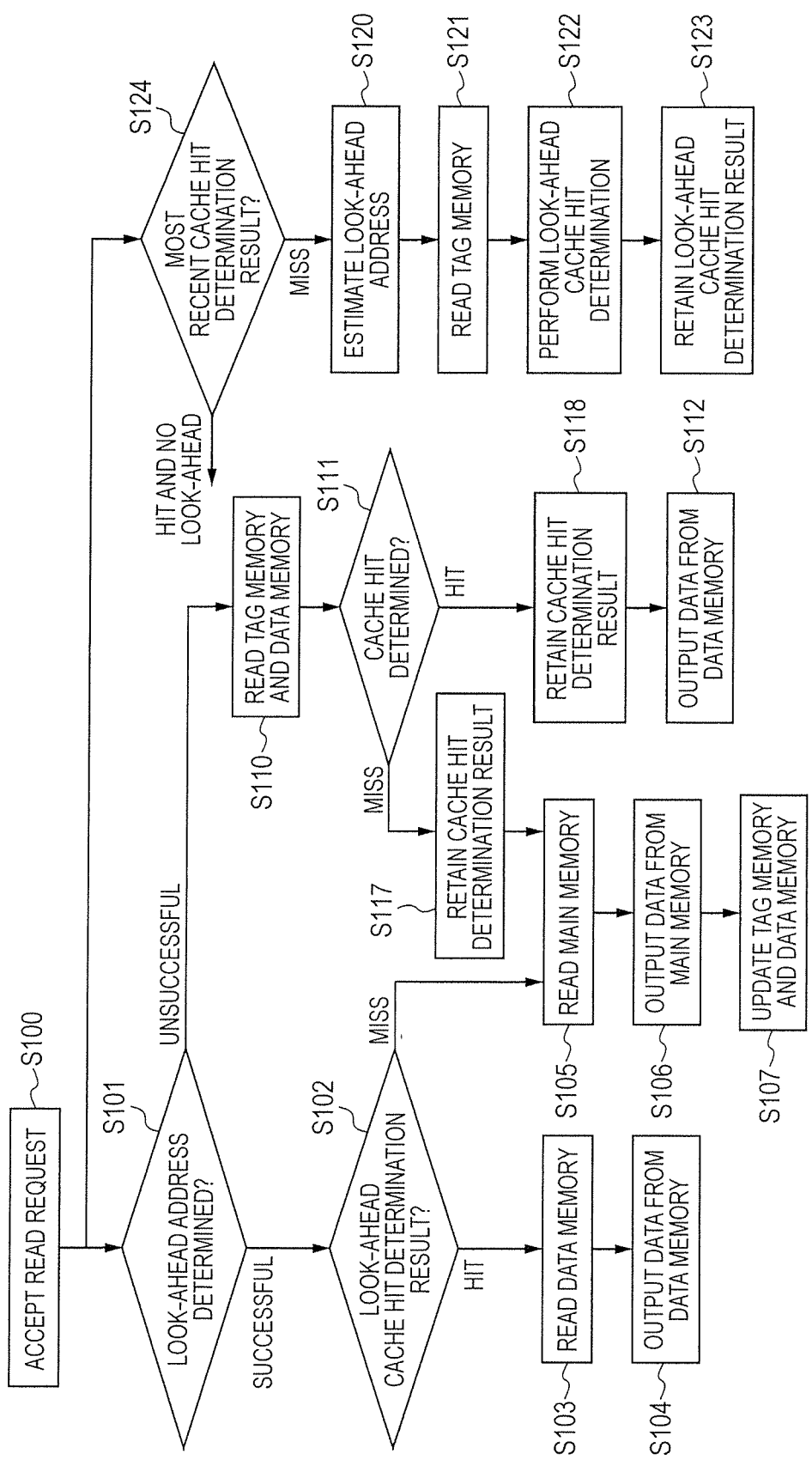
FIG. 16 is a flowchart illustrating an operation example of the cache memory according to a second embodiment.

FIG. 16 illustrates operation of the cache memory according to the present embodiment. As illustrated in FIG. 16, the present embodiment retains a cache hit determination result before the tag look-ahead and controls the tag look-ahead operation based on the retained cache hit determination result. The other operations equal the first embodiment.

The CPU 300 issues a read request (S100). In response to this, the memory access controller 108 gains read access to the tag memory 101 and the data memory 102 (S110). The cache hit determination circuit 103 performs the cache hit determination (S112). The result retention circuit 105 then retains a result of the performed cache hit determination (S117 and S118).

When the tag look-ahead is performed thereafter, the address estimation unit 109 and the memory access controller 108 confirm the most recent cache hit determination result retained in the result retention circuit 105 (S124). The tag look-ahead operation at S120 and later is performed if the most recent cache hit determination result indicates a cache miss. The tag look-ahead operation at S120 and later is not performed if the most recent cache hit determination result indicates a cache hit.

The cache memory accesses an address requested by the CPU. The address to be accessed depends on a program executed by the CPU. For example, the next one of consecutive (incremented) addresses is sequentially accessed if the executed program performs a sequential process. A distant address at a branch destination is accessed next to an occurrence of branch if the executed program performs a process such as a loop that includes a branch. The first embodiment does not consider an occurrence of branch on condition that the tag look-ahead is available. When a branch occurs, the tag look-ahead is performed on the next address before the branch occurs. The first embodiment therefore wastes the tag look-ahead in this case.

Figure 17:
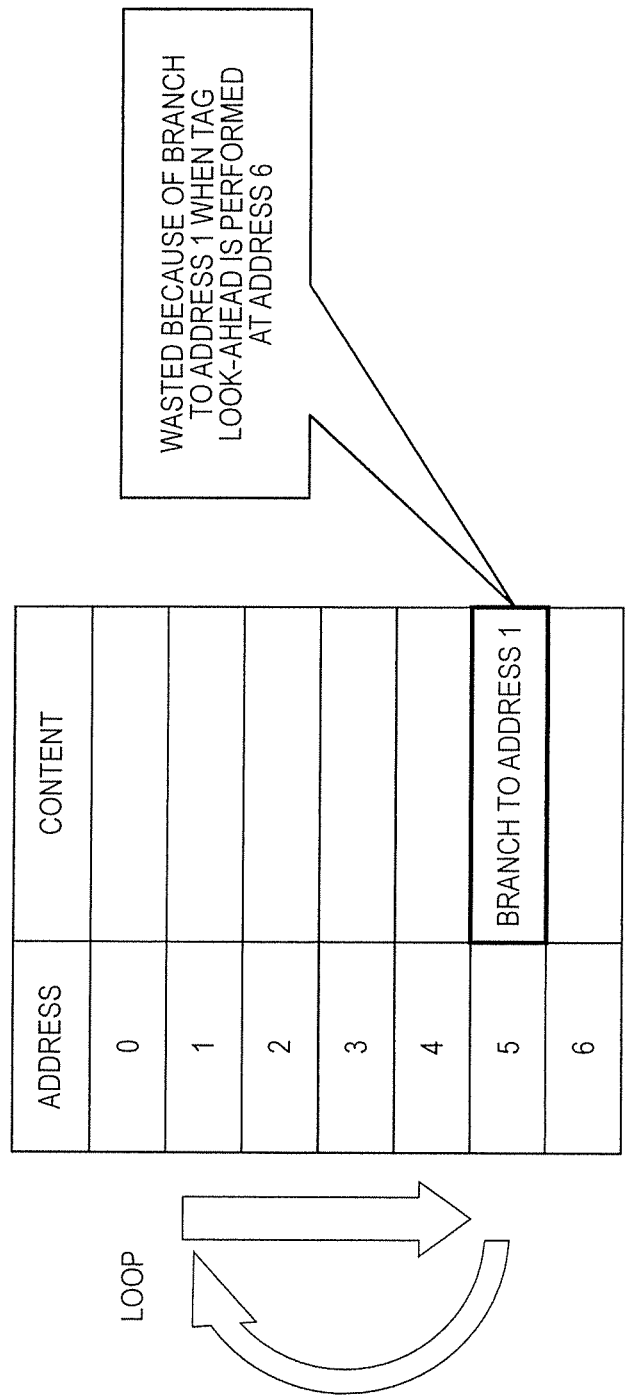
FIG. 17 is a diagram illustrating operation of the cache memory according to the second embodiment.

For example, suppose a program in FIG. 17 starts at address 0 and the content of address 5 provides a branch instruction to address 1. When the program starts at address 0 under this condition, the tag look-ahead at address 5 is targeted at address 6 according to the first embodiment. However, an actual access occurs at address 1 and the tag look-ahead is sure to fail.

The present embodiment adds a condition to perform the tag look-ahead as above in order to reduce an unsuccessful tag look-ahead. The condition to be added here is to perform the tag look-ahead only when the most recent cache hit determination indicates a cache miss. There may be provided a control to choose whether to use this condition as needed.

As above, the present embodiment is characterized by adding a condition for the tag look-ahead in comparison with the first embodiment. An unnecessary tag look-ahead can be reduced when a loop part of the program in FIG. 17 including a branch is cached.

Figure 18:
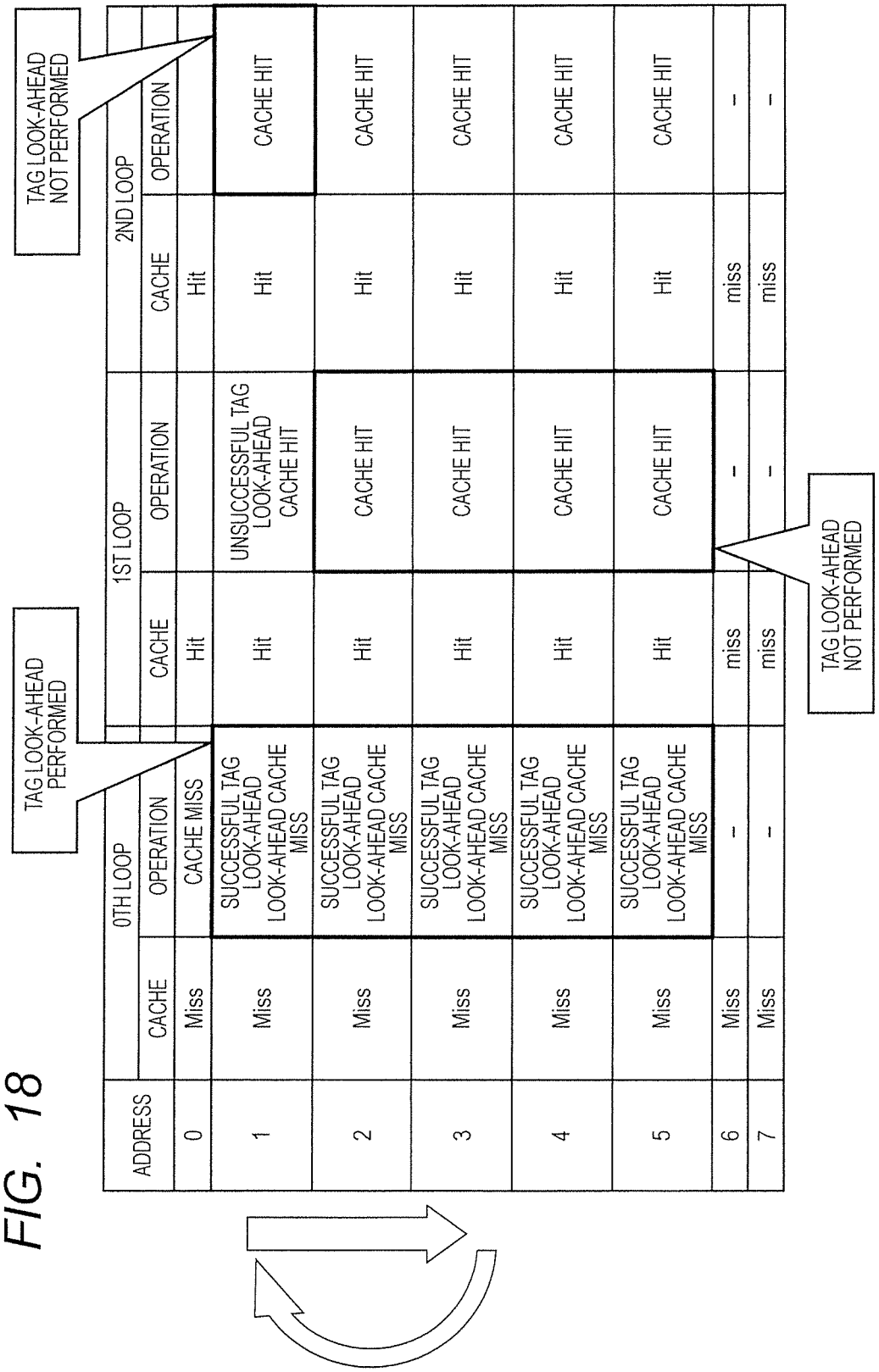
FIG. 18 is a diagram illustrating operation of the cache memory according to the second embodiment.

FIG. 18 illustrates operation of a loop processed performed by the program in FIG. 17. For example, no data is cached when address 5 is accessed for the first time (no loop). An unnecessary tag look-ahead occurs. When address 5 is accessed for the second time and later (first loop and later), data is placed in the cache (tag memory and data memory) and a cache hit occurs. No tag look-ahead occurs according to the above-mentioned condition. The present embodiment can therefore reduce the number of occurrences of unnecessary tag look-ahead.

Third Embodiment

The description below explains the third embodiment with reference to the accompanying drawings. The present embodiment describes an example of applying the tag look-ahead function (circuit) of the first embodiment to parallel cache memory. The same is also applicable to the second embodiment.

<Basic Example>

Figure 19:
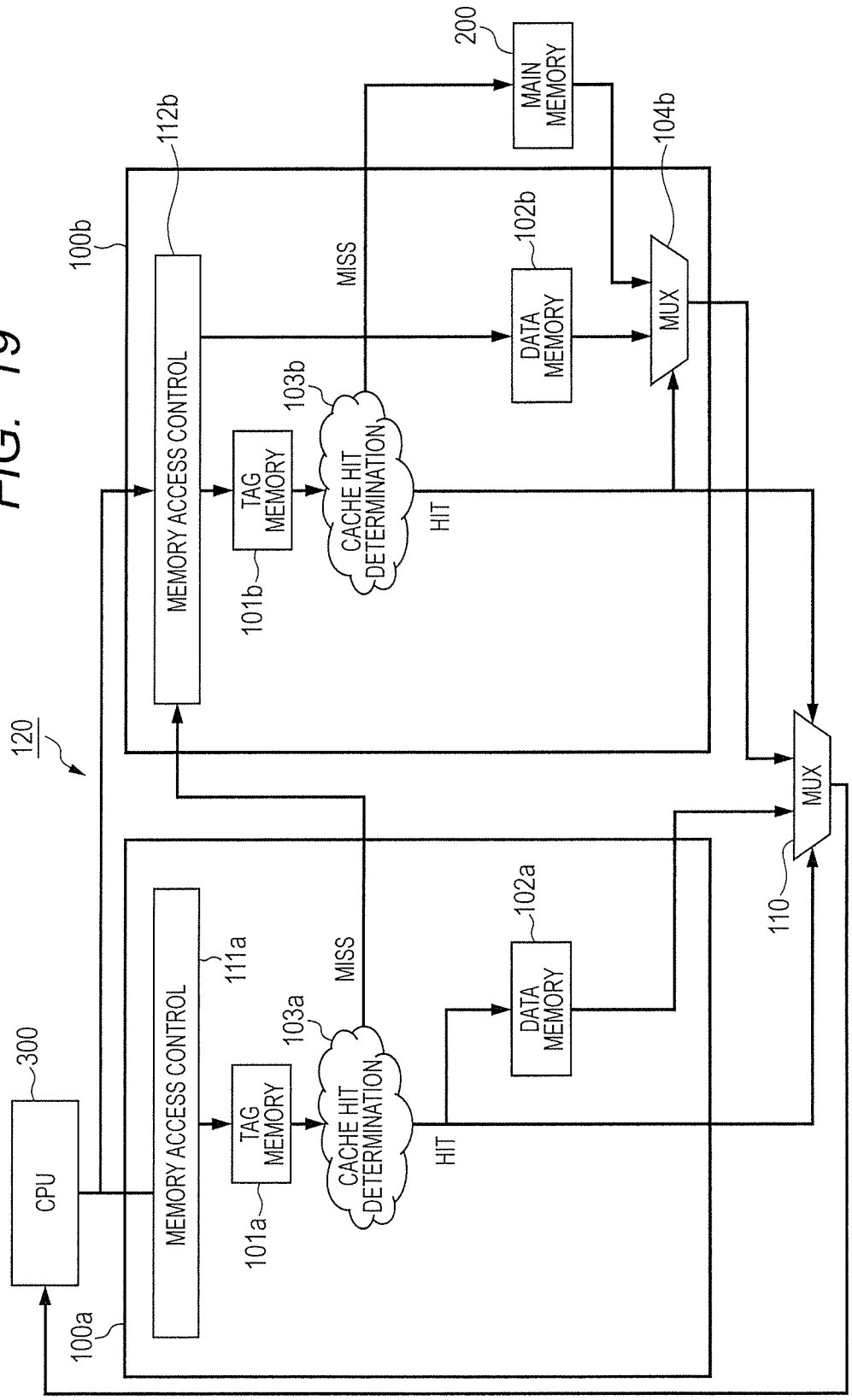
FIG. 19 is a configuration diagram illustrating a configuration example of parallel cache memory as a basic example of a third embodiment.

FIG. 19 illustrates a configuration of the basic example of the parallel cache memory. As illustrated in FIG. 19, parallel cache memory 120 according to the basic example includes L1 cache memory 100a and L2 cache memory 100b. The L1 cache memory 100a and the L2 cache memory 100b are coupled in parallel between the CPU 300 and the main memory 200. The L1 cache memory (primary cache memory or first cache memory) 100a provides less storage capacity and lower power consumption than the L2 cache memory (secondary cache memory or second cache memory) 100b and provides an access rate higher than (or equal to) the L2 cache memory. More cache memory units may be coupled in parallel.

In FIG. 19, the L1 cache memory 100a uses the cache memory according to the first implementation example and the L2 cache memory uses the cache memory according to the second implementation example, as an example. Similarly to the first implementation example, the L1 cache memory 100a includes tag memory 101a (first tag memory), data memory 102a (first data memory), a cache hit determination circuit 103a (first cache hit determination circuit), and a memory access controller 111a (first memory access controller). Similarly to the second implementation example, the L2 cache memory 100b includes tag memory 101b (second tag memory), data memory 102b (second data memory), a cache hit determination circuit 103b (second cache hit determination circuit), an MUX 104b, and a memory access controller 112b (second memory access controller). The parallel cache memory 120 also includes an MUX 110 that selects output from the L1 cache memory 100a or the L2 cache memory 100b depending on a result of the cache hit determination on the L1 cache memory 100a and the L2 cache memory 100b.

In the L1 cache memory 100a, the tag memory 101a and the data memory 102a are both configured as FF. The L1 cache memory 100a is similar to the first implementation example. Read data in the tag memory 101a is used to perform the cache hit determination. The data memory 102a is accessed for reading only when a cache hit occurs.

The tag memory 101a and the data memory 102a are configured as FF in the L1 cache memory 100a. The cache hit determination is shorter than one cycle and is free from the issue of degraded performance as is the case for the first implementation example whose configuration uses SRAM. However, configuring the tag memory 101a and the data memory 102a as FF greatly increases a circuit area compared to the configuration using SRAM.

In the L2 cache memory 100b, the tag memory 101a and the data memory 102a are both configured as SRAM. Similarly to the second implementation example, the L2 cache memory 100b simultaneously accesses the tag memory 101b and the data memory 102b, outputs read data from the data memory 102b upon occurrence of a cache hit, and gains read access to the main memory 200 upon occurrence of a cache miss.

Operation of the parallel cache memory 120 will be described. The data memory 102 accepts an access from the CPU 300. The L1 cache memory 100a then performs the cache hit determination. When a cache hit occurs, read data is output from the data memory 102a of the L1 cache memory 100a. When the L1 cache memory 100a causes a cache miss, the L2 cache memory 100b performs the cache hit determination.

When the L2 cache memory 100b causes a cache hit, the data memory 102b outputs read data. The accessed read data is placed in the tag memory 101a and the data memory 102a of the L1 cache memory 100a. When the L2 cache memory 100b also causes a cache miss, the main memory 200 is accessed to output read-out read data. The read data is placed in the tag memory 101a and the data memory 102a of the L1 cache memory 100a and in the tag memory 101b and the data memory 102b of the L2 cache memory 100b.

The parallel cache memory 120 can operate with the L1 cache memory 100a and the L2 cache memory 100b at the cycle to accept the access. The parallel cache memory can efficiently perform memory access by operating the L1 cache memory and the L2 cache memory in parallel. However, suppose the main memory is accessed similarly to the ordinary cache memory when a cache miss occurs in the L1 cache memory and the L2 cache memory. In this case, the read cycle requires an excess access cycle for tag read of the L2 cache memory.

To solve this, the present embodiment uses the tag look-ahead function (circuit) according to the first embodiment for the parallel cache memory and performs the tag look-ahead on only the L2 cache memory or on the L1 cache memory and the L2 cache memory. This causes a cache miss in the L1 cache memory and the L2 cache memory and can eliminate a cycle needed for access to the tag memory from the read cycle when the main memory is accessed.

In the description below, a first example of application describes an example of performing the tag look-ahead on only the L2 cache memory. A second example of application describes an example of performing the tag look-ahead on the L1 cache memory and the L2 cache memory.

<First Example of Application>

Figure 20:
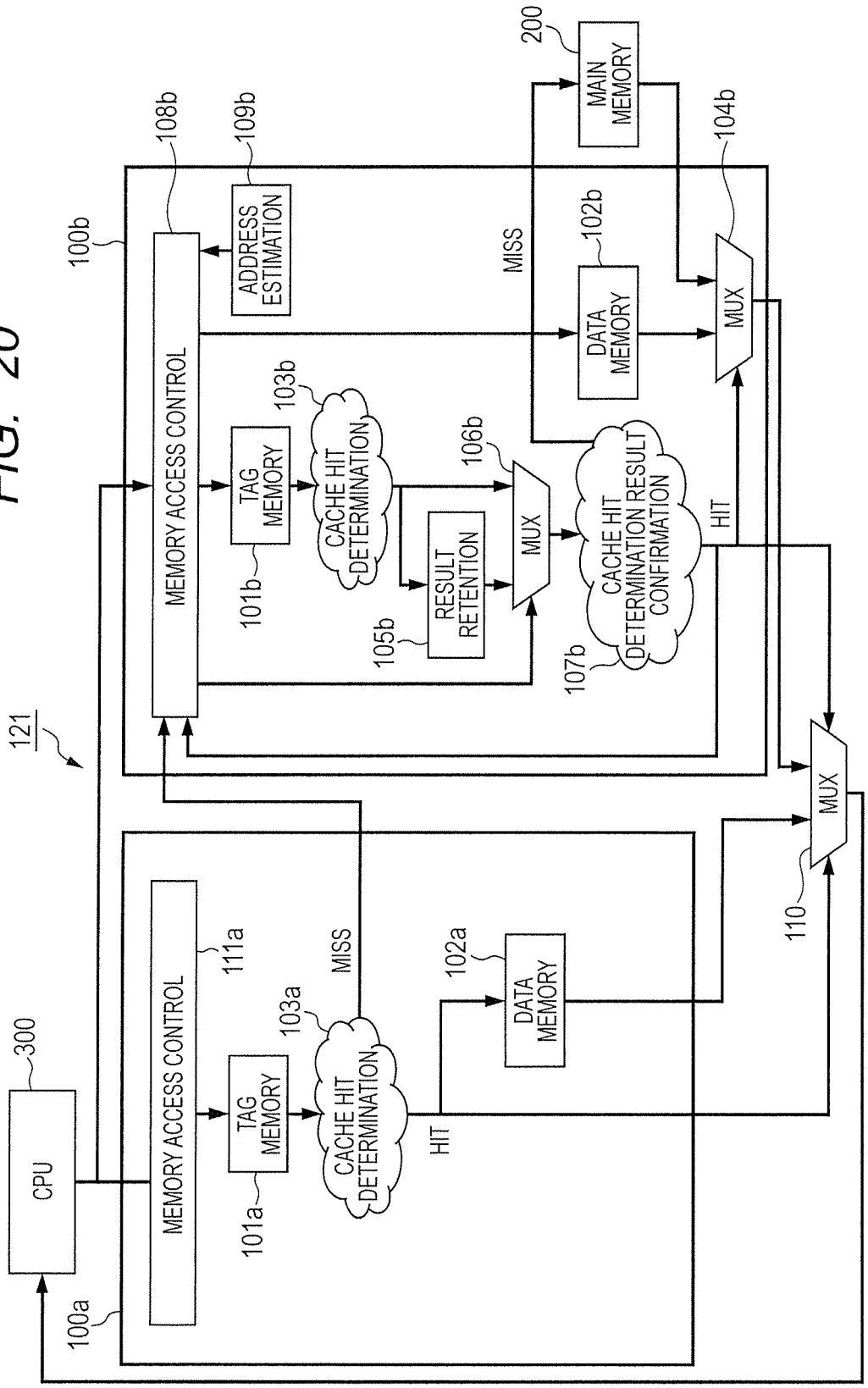
FIG. 20 is a configuration diagram illustrating a configuration example of the parallel cache memory as a first example of application of the third embodiment.

FIG. 20 illustrates a configuration example of the parallel cache memory according to the first example of application of the present embodiment. As illustrated in FIG. 20, parallel cache memory 121 according to the first example of application includes the L1 cache memory 100a and the L2 cache memory 100b. The L1 cache memory 100a is configured equally to the basic example.

Similarly to the first embodiment, the L2 cache memory 100b according to the first example of application includes tag memory 101b (second tag memory), data memory 102b (second data memory), a cache hit determination circuit 103b (second cache hit determination circuit), an MUX 104b, a result retention circuit 105b (second result retention circuit), an MUX 106b, a cache hit determination result confirmation circuit 107b (second cache hit determination result confirmation circuit), a memory access controller 108b (second memory access controller), and an address estimation unit 109b (second address estimation unit).

In the L2 cache memory 100b, the tag memory 101b and the data memory 102b are configured as SRAM. Similarly to the first embodiment, the tag look-ahead is performed in advance. The data memory 102b or the main memory 200 is accessed for reading based on a look-ahead cache hit determination result.

Figure 21A:
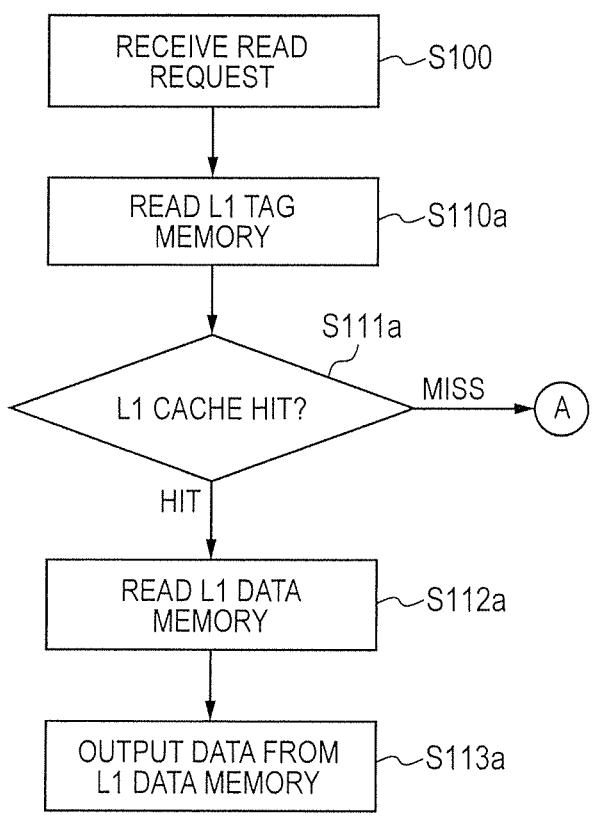
FIG. 21A is a flowchart illustrating an operation example of the parallel cache memory according to a first example of application of the third embodiment.
Figure 21B:
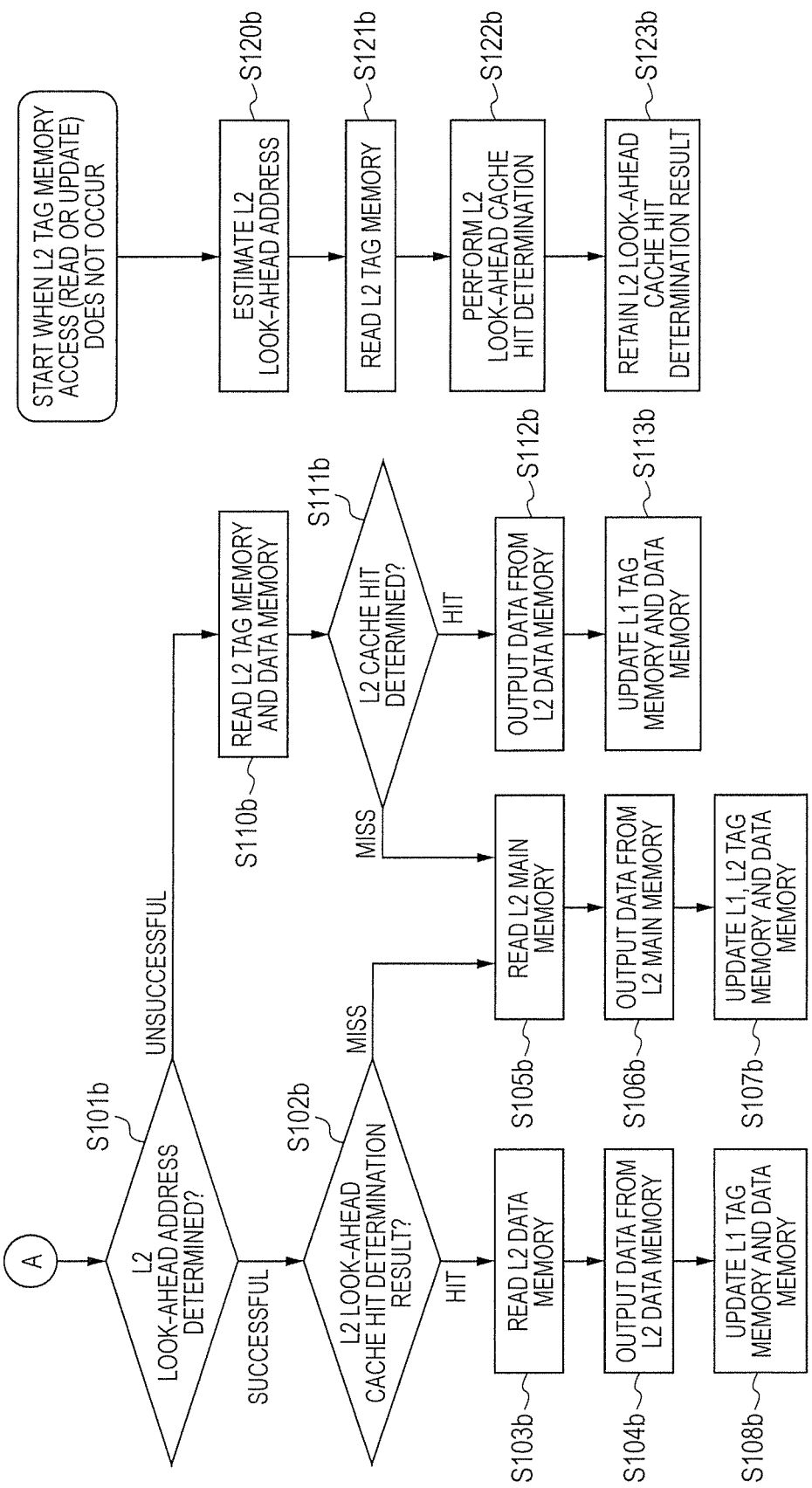
FIG. 21B is a flowchart illustrating an operation example of the parallel cache memory according to a first example of application of the third embodiment.

FIGS. 21A and 21B illustrate operation of the parallel cache memory according to the first example of application of the present embodiment. As illustrated in FIG. 21A, a read request is received from the CPU 300 (S100). The L1 cache memory 100a then performs the cache hit determination similarly to the basic example. If a cache hit occurs, read data is output from the data memory 102a (S110a through S113a).

As illustrated in FIG. 21B, the look-ahead address is determined similarly to the first embodiment if the cache hit determination on the L1 cache memory 100a results in a cache miss. The data memory 102b is accessed and read data is output if the tag look-ahead is successful and the look-ahead cache hit determination result indicates a cache hit. The accessed read data is placed in the tag memory 101a and the data memory 102a of the L1 cache memory 100a (S101b through S104b and S108b).

The main memory 200 is accessed and read data is output if the look-ahead cache hit determination result indicates a cache miss. The read data is placed in the tag memory 101a and the data memory 102a of the L1 cache memory 100a and the tag memory 101b and the data memory 102b of the L2 cache memory 100b (S105b through S107b).

The tag memory 101b and the data memory 102b are accessed if the tag look-ahead is unsuccessful. Read data is output from the data memory 102b if the cache hit determination results in a cache hit. The accessed read data is placed in the tag memory 101a and the data memory 102a of the L1 cache memory 100a (S110b through S113b). The operation from S105b through S107b is performed if the cache hit determination results in a cache miss.

The tag look-ahead in the L2 cache memory 100b is similar to the first embodiment. The next address (look-ahead address) is estimated when the tag memory 101b of the L2 cache memory is not accessed. The tag memory 101b is accessed to retain a look-ahead cache hit determination result (S120b through S123b).

<Second Example of Application>

Figure 22:
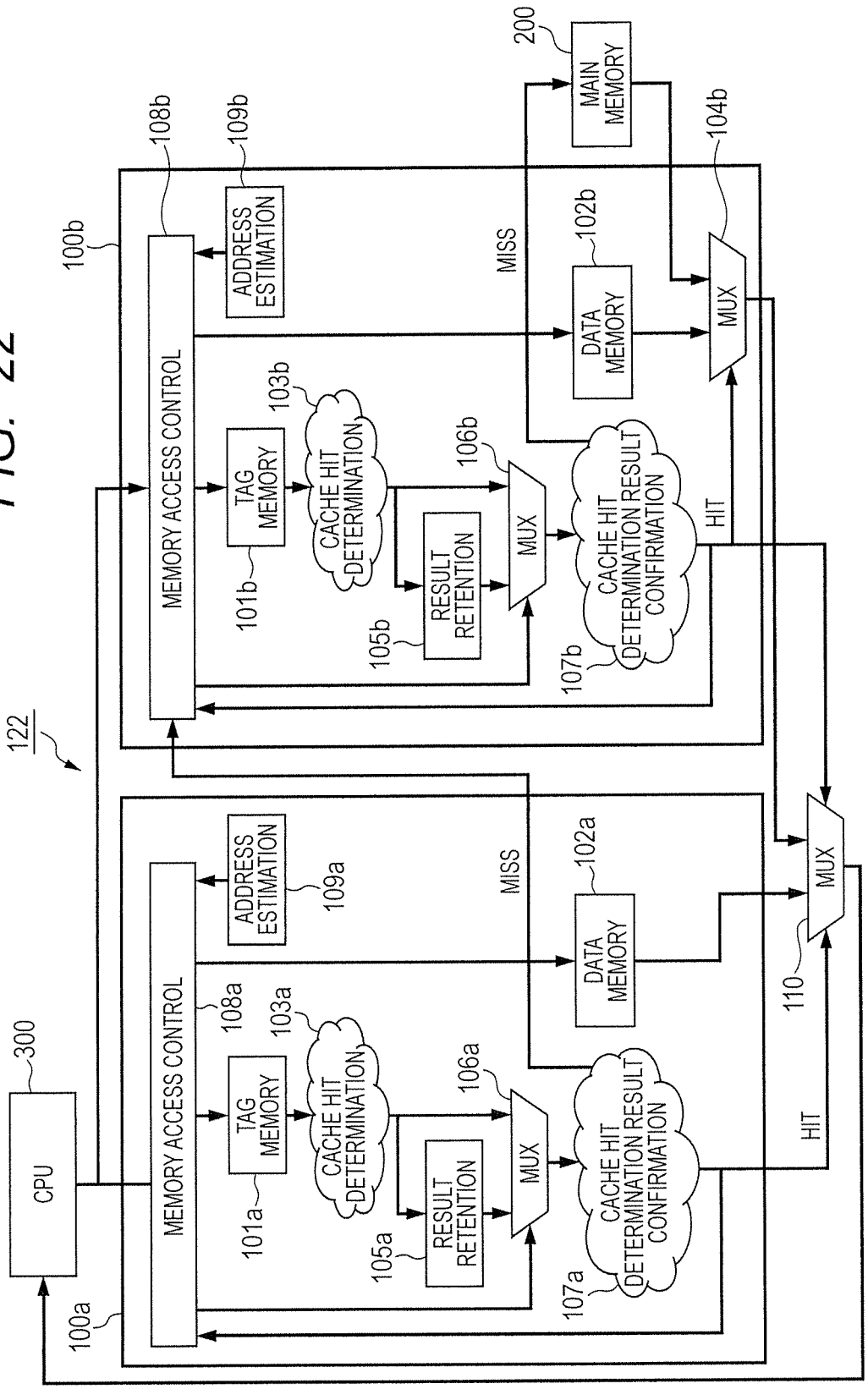
FIG. 22 is a configuration diagram illustrating a configuration example of the parallel cache memory as a second example of application of the third embodiment.

FIG. 22 illustrates a configuration example of the parallel cache memory according to the second example of application of the present embodiment. As illustrated in FIG. 22, parallel cache memory 122 according to the second example of application includes the L1 cache memory 100a and the L2 cache memory 100b. The L2 cache memory 100b is configured equally to the first example of application.

Similarly to the first embodiment, the L1 cache memory 100a according to the second example of application includes tag memory 101a (first tag memory), data memory 102a (first data memory), a cache hit determination circuit 103a (first cache hit determination circuit), a result retention circuit 105a (first result retention circuit), an MUX 106a, a cache hit determination result continuation circuit 107a (first cache hit determination result confirmation circuit), a memory access controller 108a (first memory access controller), and an address estimation unit 109a (first address estimation unit).

In the L1 cache memory 100a, the tag memory 101a and the data memory 102a are both configured as FF. The tag look-ahead is performed in advance similarly to the first embodiment. Read data in the data memory 102a is output based on a look-ahead cache hit determination result.

Figure 23A:
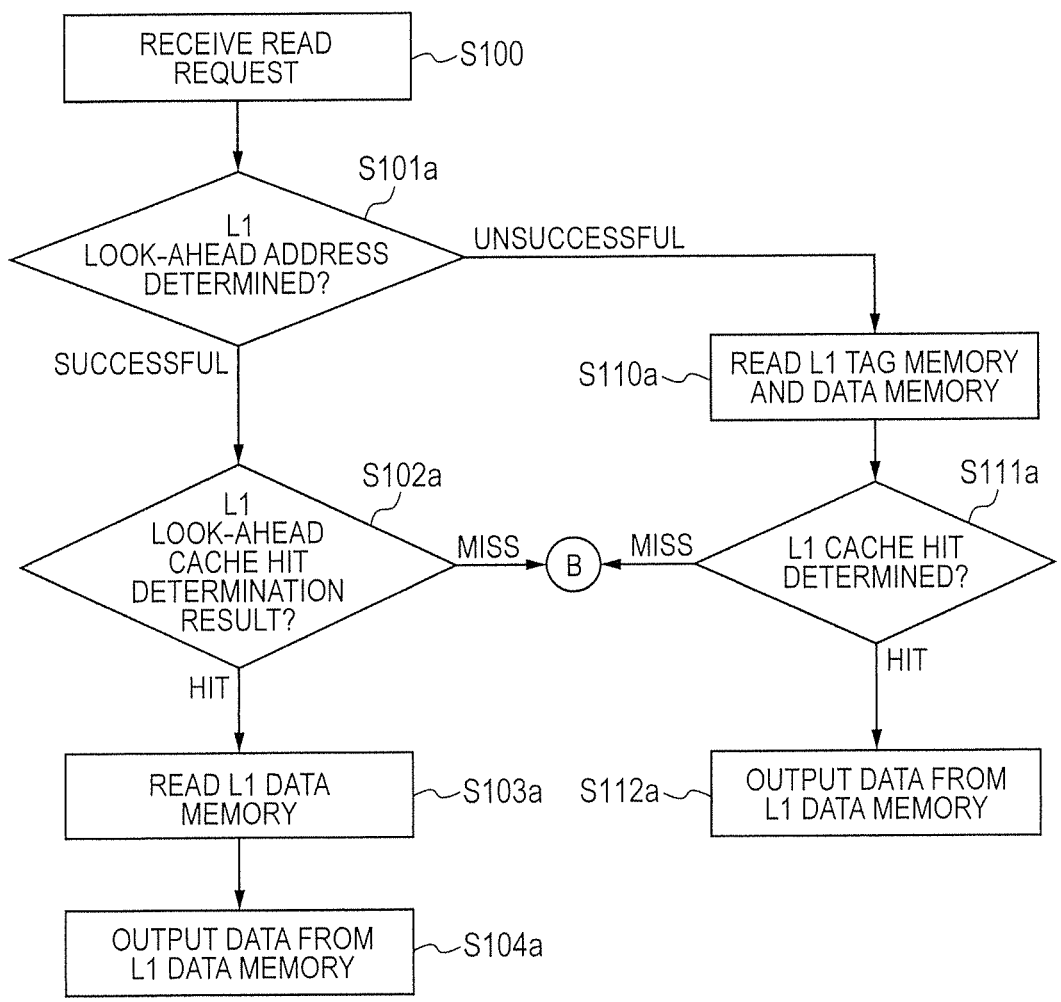
FIG. 23A is a flowchart illustrating an operation example of the parallel cache memory as the second example of application of the third embodiment.
Figure 23B:
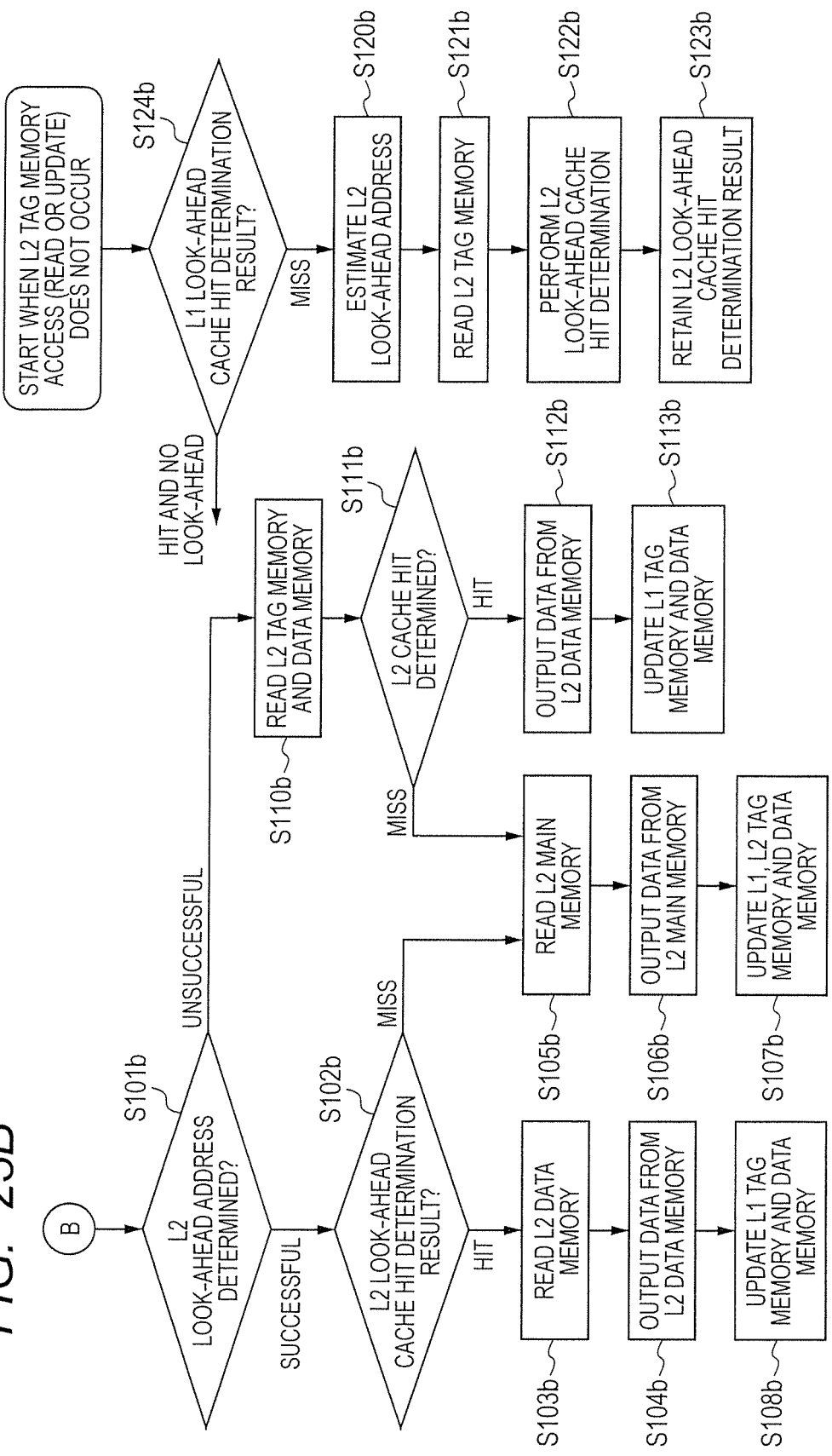
FIG. 23B is a flowchart illustrating an operation example of the parallel cache memory as the second example of application of the third embodiment.
Figure 23C:
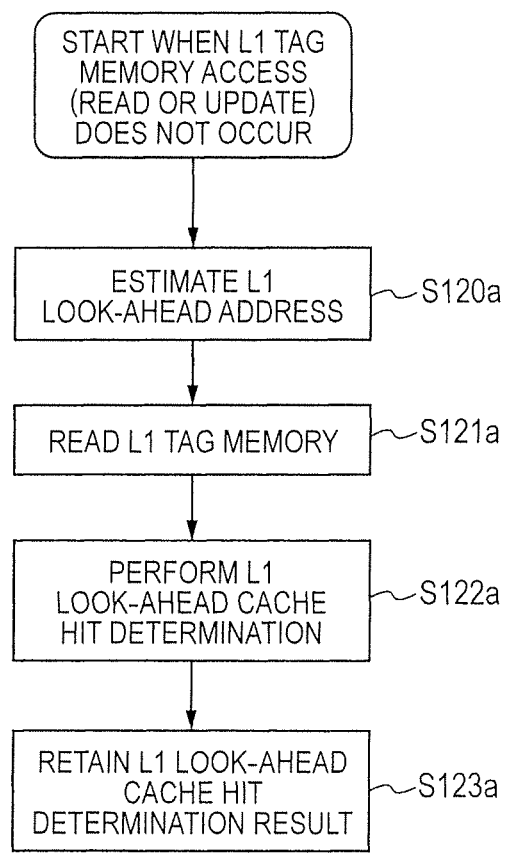
FIG. 23C is a flowchart illustrating an operation example of the parallel cache memory as the second example of application of the third embodiment.

FIGS. 23A through 23C illustrate operation of the parallel cache memory according to the second example of application of the present embodiment. The L1 cache memory 100a is similar to the first embodiment as illustrated in FIG. 23C. The next address (look-ahead address) is estimated when the tag memory 101a of the L1 cache memory is not accessed. The tag memory 101a is read to retain a look-ahead cache hit determination result (S120a through S123a).

As illustrated in FIG. 23A, a read request is then received from the CPU 300 (S100). The look-ahead address is determined similarly to the first embodiment. Read data is output from the data memory 102a if the tag look-ahead is successful and the look-ahead cache hit determination result indicates a cache hit (S101a through S104a). Data is read from the tag memory 101b if the tag look-ahead is unsuccessful. The read data is output from the data memory 102a if the cache hit determination results in a cache hit (S110a through S113a).

As illustrated in FIG. 23B, the L2 cache memory 100b performs the tag look-ahead by confirming a look-ahead cache hit determination result of the L1 cache memory (S124b). The tag look-ahead is performed (S120b through S123b) similarly to the first example of application if the look-ahead cache hit determination result of the L1 cache memory indicates a cache miss. No tag look-ahead is performed if the look-ahead cache hit determination result of the L1 cache memory indicates a cache hit.

After the tag look-ahead on the L2 cache memory 100b, the look-ahead address is determined similarly to the first example of application if the look-ahead cache hit determination result of the L1 cache memory indicates a cache miss and if the tag look-ahead is unsuccessful and the cache hit determination results in a cache miss. The operation based on a result of determining the tag look-ahead address is similar to the first example of application (S101b through S108b and S110b through S113b).

The tag look-ahead is simultaneously performed on the L1 cache memory and the L2 cache memory when the tag look-ahead function is simply provided for the L1 cache memory and the L2 cache memory of the parallel cache memory. L2 caching may cause unnecessary tag look-ahead. For example, L2 caching results in unnecessary tag look-ahead if L1 caching causes the cache hit determination on the tag look-ahead to result in a cache hit.

In order to avoid an unnecessary tag look-ahead, the present embodiment adds the condition to perform the tag look-ahead in the L2 cache memory as above and thereby prevents the L2 cache from unconditionally performing the tag look-ahead. Adding the condition to perform the tag look-ahead for the L2 cache memory can prevent an unnecessary tag look-ahead from being performed and expect an effect of reducing the power consumption needed to access the cache memory.

The tag look-ahead for the L2 cache memory is unnecessary when the L1 cache memory registers an address targeted at the tag look-ahead. A condition not to perform the tag look-ahead is added under this situation. The situation is applicable when the tag look-ahead in the L1 cache memory causes the cache hit determination to result in a cache hit, for example. In this case, a possible condition is not to perform the tag look-ahead in the L2 cache memory. Moreover, the configuration of the parallel cache memory can provide a condition for the L2 cache memory to perform the tag look-ahead. The tag look-ahead condition for the L2 cache memory may be therefore optimized for the parallel cache memory configuration.

The description below explains a specific example of the second example of application. As above, an effective tag look-ahead condition for the L2 cache memory depends on the parallel cache memory configuration. The tag look-ahead condition here assumes a 64-bit data bus width between the parallel cache memory and an accessing master (such as CPU) and a 128-bit data bus width between the cache memory and the main memory. In this case, the data memory holds 128 bits of read data. The following look-ahead condition is applicable when the bus width between the master and the cache is half the bus width between the cache and the main memory.

Suppose the master accesses the parallel cache memory based on the above-mentioned configuration. In this case, the parallel cache memory can be assumed to operate under three situations as follows: (1) a cache hit occurs in the L1 cache memory; (2) a cache miss occurs in the L1 cache memory; and (3) a cache miss occurs in both the L1 cache memory and the L2 cache memory.

(1) Suppose a cache hit occurs in the L1 cache memory. The cache memory holds 128 bits of read data. The L1 cache memory is therefore sure to hold read data for an address before or after the currently accessed address.

(2) Suppose a cache miss occurs in the L1 cache memory. The L1 cache memory registers 128 bits of read data for the cache hit in the L2 cache memory. Similarly to (1), the next access allows the L1 cache memory to hold read data for an address before or after the currently accessed address.

(3) Suppose a cache miss occurs in both the L1 cache memory and the L2 cache memory. The L1 cache memory and the L2 cache memory similarly register 128 bits of read data that is read from the main memory. The L1 cache memory holds the read data for an address before or after the currently accessed address.

Suppose access to an address whose four low-order bits correspond to 00h. At the time point the read data is read, the L1 cache memory registers the read data for consecutive address 08h. Namely, the tag look-ahead at 08h in the L2 cache memory is sure to be wasteful when addresses 00h, 08h, and 10h are accessed consecutively without branching.

It is not ensured that the cache memory registers data corresponding to the content of the address (10h) next to 08h. The L1 cache memory therefore performs the tag look-ahead. Based on a result of the tag look-ahead, it is determined whether to perform the tag look-ahead on the L2 cache memory. The tag look-ahead is not performed on the L2 cache memory if a cache hit occurs in the L1 cache memory. The tag look-ahead is performed on the L2 cache memory if a cache miss occurs in the L1 cache memory.

In consideration of the foregoing, the tag look-ahead condition for the L2 cache memory is formulated as "accessing address 8 indicated by four low-order bits of a non-branch address in a cacheable area and performing the tag look-ahead in the L1 cache memory at address 0 as the next consecutive address to cause a cache miss." The condition can reduce unnecessary tag look-ahead in the L2 cache memory.

According to the above-mentioned embodiment, a program executed by the CPU or a program needed to implement cache memory operation as software is stored by using various types of non-transitory computer readable medium and can be supplied to computers. The non-transitory computer readable medium includes various types of tangible storage medium. Examples of the non-transitory computer readable medium include a magnetic recording medium (such as flexible disk, magnetic tape, and hard disk drive), a magnet-optical recording medium (such as magnet-optical disk), CD-ROM (Read Only Memory), CD-R, CD-R/W, and semiconductor memory (such as mask ROM, PROM (Programmable ROM), EPROM (Erasable PROM), flash ROM, and RAM (Random Access Memory)). The program may be supplied to computers by using various types of transitory computer readable medium. Examples of the transitory computer readable medium include electric signals, optical signals, and electromagnetic waves. The transitory computer readable medium can supply the program to computers by using wired communication paths such as an electric cable and optical fiber or wireless communication paths.

While there have been described the specific embodiments of the invention made by the inventors, it is to be distinctly understood that the present invention is not limited to the above-mentioned embodiments and may be embodied in various modifications without departing from the spirit and scope of the invention.

What is claimed is:

1. A cache memory device comprising:
data memory that stores cache data corresponding to data in main memory;
tag memory that stores tag information to identify the cache data;
an address estimation unit that estimates a look-ahead address to be accessed in response to a subsequent access request;
a cache hit determination unit that performs cache hit determination on the look-ahead address, based on the stored tag information;
a cache hit determination result retention unit that retains a cache hit determination result of the look-ahead address; and
an access controller that 1) receives an access request from an external device and 2) accesses, in response to receiving the access request, one of the data memory and the main memory based on the retained cache hit determination result,
wherein prior to the access controller receiving the subsequent access request, 1) the address estimation unit estimates the look-ahead address to be accessed in response to the subsequent access request by presuming that the subsequent access request is received, 2) the cache hit determination unit performs the cache hit determination on the look-ahead address based on the stored tag information, and 3) the cache hit determination result retention unit retains the cache hit determination result of the look-ahead address,
wherein when the access controller receives the subsequent access request, the access controller 1) accesses, without accessing the tag memory, the cache hit determination result retention unit, 2) determines whether the look-ahead address of the cache hit determination result retained in the cache hit determination result retention unit matches an address associated with the received subsequent access request, and 3) accesses one of the data memory and the main memory based on a determination result of whether the look-ahead address of the cache hit determination result retained in the cache hit determination result retention unit matches the address associated with the received subsequent access request,
wherein, when the look-ahead address of the cache hit determination result retained in the cache hit determination result retention unit is determined to match the address associated with the received subsequent access request prior to the access controller received the subsequent access request, the access controller accesses the data memory and outputs data read from the data memory to the external device, and
wherein, when the look-ahead address of the cache hit determination result retained in the cache hit determination result retention unit is determined to be different from the address associated with the received subsequent access request prior to the access controller received the subsequent access request, the access controller accesses the main memory and outputs data read from the main memory to the external device.

2. The cache memory device according to claim 1, wherein the look-ahead address is contiguously next to the address associated with the received subsequent access request.

3. The cache memory device according to claim 1,
wherein the look-ahead address is estimated based on data for the address associated with the received subsequent access request.

4. The cache memory device according to claim 1,
wherein the cache hit determination unit performs cache hit determination on the address associated with the received subsequent access request, and
wherein the address estimation unit estimates the look-ahead address when cache hit determination on the address associated with the received subsequent access request results in a cache miss.

5. The cache memory device according to claim 1,
wherein the address estimation unit estimates the look-ahead address based on an input look-ahead control signal.

6. The cache memory device according to claim 1,
wherein the data memory and the tag memory use one clock cycle needed for access.

7. The cache memory device according to claim 1,
wherein the data memory and the tag memory are available as SRAM (Static Random Access Memory).

8. A cache memory device comprising:
data memory that stores cache data corresponding to data in main memory;
tag memory that stores tag information to identify the cache data;
an address estimation unit that estimates a look-ahead address to be accessed in response to a subsequent access request;
a cache hit determination unit that performs cache hit determination on the look-ahead address, based on the stored tag information;
a cache hit determination result retention unit that retains a cache hit determination result of the look-ahead address; and
an access controller that 1) receives an access request from an external device and 2) accesses, in response to receiving the access request, one of the data memory and the main memory based on the retained cache hit determination result,
wherein prior to the access controller receiving the subsequent access request, 1) the address estimation unit estimates the look-ahead address to be accessed in response to the subsequent access request, 2) the cache hit determination unit performs the cache hit determination on the look-ahead address based on the stored tag information, and 3) the cache hit determination result retention unit retains the cache hit determination result of the look-ahead address,
wherein, when the access controller receives the subsequent access request, the access controller 1) accesses the cache hit determination result retention unit, 2) determines whether the look-ahead address of the cache hit determination result retained in the cache hit determination result retention unit matches an address associated with the received subsequent access request by presuming that the subsequent access request is received, and 3) accesses one of the data memory and the main memory based on a determination result of whether the look-ahead address of the cache hit determination result retained in the cache hit determination result retention unit matches the address associated with the received subsequent access request,
wherein, when the look-ahead address of the cache hit determination result retained in the cache hit determination result retention unit differs from the address associated with the received subsequent access request prior to the access controller received the subsequent access request, the cache hit determination unit performs cache hit determination on the address associated with the received subsequent access request, and
wherein, when the look-ahead address of the cache hit determination result retained in the cache hit determination result retention unit differs from the address associated with the received subsequent access request, the access controller 1) accesses the tag memory and the data memory, 2) obtains a cache hit determination result of the address associated with the received subsequent access request performed by the cache hit determination unit 3) accesses the main memory based on the cache hit determination result of the address associated with the received subsequent access request and 4) outputs data read from the main memory to the external device.

9. A semiconductor device comprising:
main memory;
cache memory that temporarily stores main memory data;
a master that transmits a subsequent access request and accesses the main memory via the cache memory; and
an address estimation unit that estimates a look-ahead address to be accessed by the master when the master transmits the subsequent access request,
wherein the cache memory includes:
    data memory that stores cache data corresponding to data in the main memory;
    tag memory that stores tag information to identify the cache data;
    a cache hit determination unit that performs cache hit determination on the look-ahead address, based on the stored tag information;
    a cache hit determination result retention unit that retains a cache hit determination result of the look-ahead address; and
    an access controller that 1) receives an access request from the master and 2) accesses, in response to receiving the access request, one of the data memory and the main memory based on the retained cache hit determination result,
wherein prior to the access controller receiving the subsequent access request, 1) the address estimation unit estimates the look-ahead address to be accessed in response to the subsequent access request by presuming that the subsequent access request is received, 2) the cache hit determination unit performs the cache hit determination on the look-ahead address based on the stored tag information, and 3) the cache hit determination result retention unit retains the cache hit determination result of the look-ahead address,
wherein when the access controller receives the subsequent access request, the access controller 1) accesses, without accessing the tag memory, the cache hit determination result retention unit, 2) determines whether the look-ahead address of the cache hit determination result retained in the cache hit determination result retention unit matches an address associated with the received subsequent access request, and 3) accesses one of the data memory and the main memory based on a determination result of whether the look-ahead address of the cache hit determination result retained in the cache hit determination result retention unit matches the address associated with the received subsequent access request, wherein, when the look-ahead address of the cache hit determination result retained in the cache hit determination result retention unit matches the address associated with the received subsequent access request, the access controller accesses the data memory and outputs data read from the data memory to the master without accessing the tag memory, and wherein, when the look-ahead address of the cache hit determination result retained in the cache hit determination result retention unit is determined to be different from the address associated with the received subsequent access request prior to the access controller received the subsequent access request, the access controller accesses the main memory and outputs data read from the main memory to the master.

* * * * *